United States Patent
Mori et al.

(10) Patent No.: US 6,236,605 B1
(45) Date of Patent: May 22, 2001

(54) SEMICONDUCTOR INTEGRATED CIRCUIT AND SEMICONDUCTOR MEMORY DEVICE INCLUDING OVERDRIVING SENSE AMPLIFIER

(75) Inventors: Kaoru Mori; Ayako Kitamoto; Masato Matsumiya; Masato Takita; Shinichi Yamada; Koichi Nishimura; Atsushi Hatakeyama, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/501,269

(22) Filed: Feb. 9, 2000

(30) Foreign Application Priority Data

Mar. 26, 1999 (JP) ................................. 11-084510
Mar. 26, 1999 (JP) ................................. 11-084715

(51) Int. Cl.$^7$ ....................................... G11C 7/00
(52) U.S. Cl. ................... 365/205; 365/206; 365/207; 365/189.09
(58) Field of Search ................... 365/205, 206, 365/207, 189.09

(56) References Cited

U.S. PATENT DOCUMENTS

| | | | |
|---|---|---|---|
| 5,337,283 | 8/1994 | Ishikawa | 365/222 |
| 5,646,900 | 7/1997 | Tsukude et al. | 365/205 |
| 5,742,552 | 4/1998 | Greenberg | 365/210 |
| 5,751,170 | 5/1998 | Pyeon | 327/57 |
| 5,751,651 | 5/1998 | Ooishi | 365/226 |
| 5,764,580 | 6/1998 | Suzuki et al. | 365/205 |
| 5,831,910 | 11/1998 | Suzuki et al. | 365/189.11 |
| 5,872,737 | 2/1999 | Tsuruda et al. | 365/189.05 |
| 5,881,005 | 3/1999 | Otori et al. | 365/205 |
| 5,949,729 * | 9/1999 | Suyama et al. | 365/205 |
| 5,969,998 * | 10/1999 | Oowaki et al. | 365/189.09 |
| 6,031,779 * | 2/2000 | Takahashi et al. | 365/205 |
| 6,115,316 * | 9/2000 | Mori et al. | 365/205 |

FOREIGN PATENT DOCUMENTS

| | | |
|---|---|---|
| 197 56 928 | 12/1998 | (DE) . |
| 0 558 970 A2 | 9/1993 | (EP) . |
| 10-284705 | 10/1998 | (JP) . |

* cited by examiner

Primary Examiner—Son T. Dinh
(74) Attorney, Agent, or Firm—Arent, Fox Kintner Plotkin Kahn PLLC

(57) ABSTRACT

A transistor of a driver in the semiconductor integrated circuit according to the present invention has its gate connected to a controlling circuit, and has its drain connected to a sense amplifier. The controlling circuit supplies the gate of the transistor with a gate-to-source voltage exceeding or below other power supply voltages. The drain-to-source resistance of the transistor in the on state becomes sufficiently lower as compared with that in the case of supplying the power supply voltages between the gate and source of the transistor. Accordingly, the amplifying speed of the sense amplifier is heightened without altering the sense amplifier and the driver. Besides, the amplifying speed of the sense amplifier is heightened without raising the power supply voltage which supplies the carriers to the driver. The semiconductor memory device according to the present invention switches the driving supply voltage for the sense amplifier from the first supply voltage, to the second supply voltage lower than the first voltage. The timing at which the first supply voltage is switched to the second supply voltage is controlled in accordance with the voltage on a dummy bit line which is driven by a monitoring sense amplifier. Accordingly, even when the driving speed of the sense amplifier using the overdriving system has fluctuated due to the fluctuation of the first supply voltage, the driving supply voltage of the sense amplifier can be always switched to the second supply voltage at the appropriate timing.

17 Claims, 29 Drawing Sheets

(A) booster
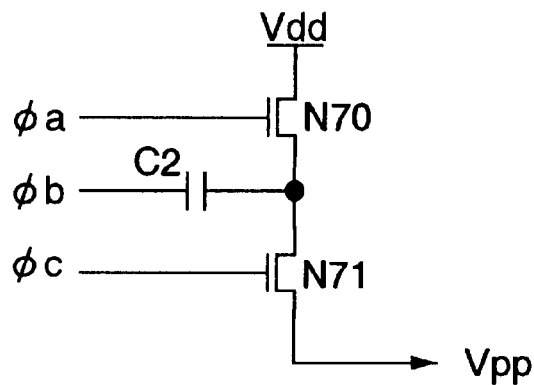
(B) voltage lowering circuit
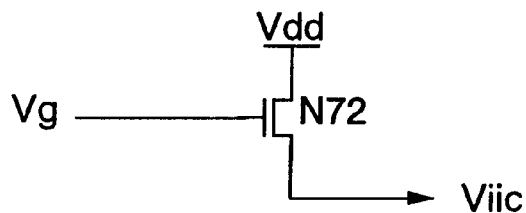
(C) relation of supply voltages
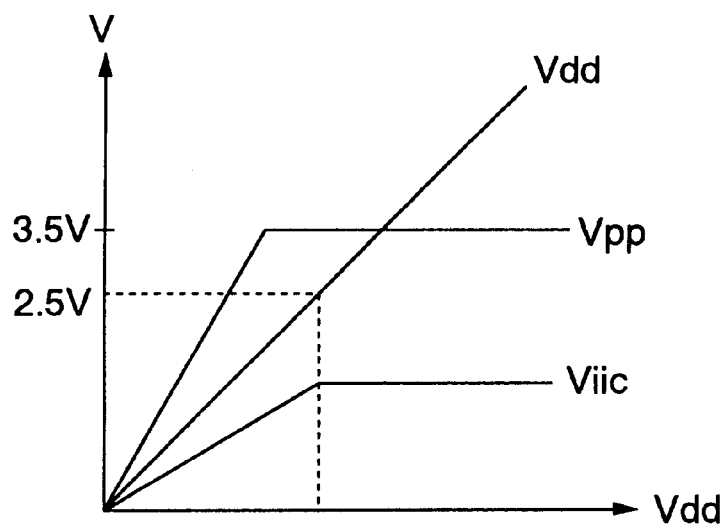
Fig. 26

SEMICONDUCTOR INTEGRATED CIRCUIT AND SEMICONDUCTOR MEMORY DEVICE INCLUDING OVERDRIVING SENSE AMPLIFIER

BACKGROUND OF THE INVENTION

1. Field of the Invention

The present invention relates to a semiconductor integrated circuit which includes a sense amplifier for amplifying a weak signal.

In addition, the present invention relates to a semiconductor memory device such as DRAMs, and more particularly to a semiconductor memory device including an overdriving sense amplifier.

2. Description of the Related Art

Not only a large memory capacity, but also a low power consumption and a high speed operation are increasingly required of a dynamic random access memory (DRAM).

Besides, in general, an integrated circuit such as semiconductor memory has a sense amplifier for amplifying data read out of a memory cell.

FIG. 1 shows an outline of a memory core unit of DRAMs.

A plurality of rectangular memory cell arrays 2 are arranged in the memory core unit 1. Each of the memory cell arrays 2 is configured of a plurality of memory cells MC which are arranged vertically and horizontally. The memory cell arrays 2 are surrounded with sense amplifier rows 3 and sub word decoder rows 4 which are respectively arranged in the horizontal direction and vertical direction. Sense amplifier drivers 5 are arranged in regions in which the sense amplifier rows 3 and the sub word decoder rows 4 intersect (regions which confront the four corners of the memory cell arrays 2).

Word lines WL (hereinbelow, also individually termed "word lines WL0 and WL1") are connected to the memory cell arrays 2, arranged from the sub word decoder rows 4 on the upper sides of the memory cell arrays 2 as viewed in the figure. Besides, bit lines BL and BLB are connected to the memory cell arrays 2, and they are arranged alternately from the sense amplifier rows 3 on both the sides of the memory cell arrays 2 as viewed in the figure. The bit lines BL and BLB are complementary bit lines in which, when one of them is used for reading data, the other is set at a reference voltage. The sense amplifier rows 3 are controlled by the sense amplifier drivers 5 on the upper sides of these sense amplifier rows as viewed in the figure.

FIG. 2 shows the details of the memory core unit 1 and a peripheral circuit unit 15.

Each of the sense amplifier rows 3 includes a plurality of sense amplifiers AMP, precharging circuits 6, and nMOS transistors 7a, 7b, 7c, 7d. The bit line BL is connected to the corresponding sense amplifier AMP through the nMOS transistors 7a, 7b. On the other hand, the bit line BLB is connected to the corresponding sense amplifier AMP through the nMOS transistors 7c, 7d. A controlling signal BT1 is applied to the gates of the nMOS transistors 7a, 7c, while a controlling signal BT2 is applied to the gates of the nMOS transistors 7b, 7d.

The sense amplifier AMP has two CMOS inverters 8, 9. The input nodes and output nodes of the CMOS inverters 8, 9 are interconnected. A sense amplifier driving signal VP is applied to the sources of pMOS transistors 8a, 9a constituting the respective CMOS inverters 8, 9. Also, a sense amplifier driving signal VN is applied to the sources of nMOS transistors 8b, 9b constituting the respective CMOS inverters 8, 9. The output nodes of the CMOS inverters 8, 9 are respectively connected to the bit lines BL, BLB. By the way, in the following description, a pMOS transistor and an nMOS transistor shall be simply termed "pMOS" and "nMOS", respectively.

In order to operate the plurality of sense amplifiers AMP at high speed, wiring patterns for the sense amplifier driving signals VP, VN are widened, so that they have large load capacitance.

The precharging circuit 6 has the bit lines BL and BLB connected thereto, and is fed with a precharging signal PR and a precharged voltage VPR. The precharged voltage VPR is a voltage which is equal to one half of an internal supply voltage Vii. The precharging circuit 6 is a circuit which supplies the precharged voltage VPR to the bit lines BL, BLB, and which equalizes the bit lines BL, BLB.

The word lines WL0, WL1 are respectively connected to the gates of the cell transistors TR0, TR1 (both being nMOS's) of the memory cells MC0, MC1. The bit lines BL, BLB are respectively connected to the sides of the cell transistors TR0, TR1 opposite to the cell capacitors of the memory cells MC0, MC1.

The sense amplifier driver 5 includes a pMOS 11, the gate of which is fed with a sense amplifier activating signal SAB. The sense amplifier driving signal VP is outputted from the drain of the pMOS 11. Also included is an nMOS 14, the source of which is supplied with a ground voltage VSS. A sense amplifier activating signal SA is applied to the gate of the nMOS 14. The sense amplifier driving signal VN is outputted from the drain of the nMOS 14. The precharging signal PR is applied to the gates of nMOS's 12, 13 which are located centrally in the sense amplifier driver 5. The precharged voltage VPR is supplied to the source of the nMOS 12 and the drain of the nMOS 13.

The pMOS 11 and the nMOS 14 supply the internal supply voltage Vii and the ground voltage VSS to the respective sense amplifier driving signals VP, VN of large load capacitance, and they have high drivability in order to operate the plurality of sense amplifiers AMP at high speed. Consequently, the sizes of the pMOS 11 and the nMOS 14 are large.

On the other hand, the peripheral circuit unit 15 has a timing generator 16, a PR generator 17 for generating the precharging signal PR, and an SA generator 18 for generating the sense amplifier activating signals SA, SAB. This peripheral circuit unit 15 is formed in a region outside the memory core unit 1 shown in FIG. 1. Besides the above circuits 16, 17 and 18, pads, an input/output buffer, a main word decoder, a column decoder, or the like, which are not shown, are arranged in the peripheral circuit unit 15.

The timing generator 16 generates and outputs a precharging timing signal PRT which controls the precharging timing of the bit lines BL, BLB, and a sense amplifier timing signal SAT which controls the driving timing of the sense amplifier AMP.

The PR generator 17 receives the precharging timing signal PRT and a decoding signal WDEC of row addresses, and outputs the precharging signal PR which becomes a low level at the activation of the sense amplifier AMP.

The SA generator 18 receives the sense amplifier timing signal SAT and the decoding signal WDEC, and outputs the sense amplifier activating signals SAB, SA.

FIG. 3 shows the details of the SA generator 18.

The SA generator 18 is configured of a logic circuit 19 and four CMOS inverters 20, 21, 22, and 23. The logic circuit 19 is fed with the decoding signal WDEC and the sense amplifier timing signal SAT, and outputs signals SAB0, SA0 for activating the sense amplifier AMP. The activating signals SAB0, SA0 are signals whose phases are inverted from each other. The internal supply voltage Vii and the ground voltage VSS are respectively supplied to the sources of the pMOS's 20a, 21a, 22a, 23a and nMOS's 20b, 21b, 22b, 23b of the CMOS inverters 20, 21, 22, 23. The CMOS inverter 20 receives the activating signal SAB0 through the CMOS inverter 23, and outputs the received signal as the sense amplifier activating signal SAB. Likewise, the CMOS inverter 21 receives the activating signal SA0 through the CMOS inverter 22, and outputs the received signal as the sense amplifier activating signal SA. The sense amplifier activating signals SAB and SA are signals which become a low level and a high level at the activation of the sense amplifier AMP, respectively.

In the DRAM described above, for example, a read cycle is performed in order to read out data of high level written in the memory cell MC0 shown in FIG. 2.

FIG. 4 shows the timings of the principal signals in the read cycle.

Before the read cycle, the precharging signal PR is at a high level (a boost voltage VPP), the word line WL0 is at a low level (a resetting voltage VMI), and the sense amplifier activating signals SA and SAB are at the low level (the ground voltage VSS) and the high level (the internal supply voltage Vii), respectively. On this occasion, the timing generator 16 shown in FIG. 2 holds the timing signal PRT at a high level and the sense amplifier timing signal SAT at a low level. The boost voltage VPP is a voltage higher than the internal supply voltage Vii, while the resetting voltage VMI is a voltage lower than the ground voltage VSS.

During the high level of the precharging signal PR, the sense amplifier driver 5 turns on the nMOS's 12, 13, thereby to supply the precharged voltage VPR as the sense amplifier driving signals VP, VN. Also, during the high level of the precharging signal PR, the precharging circuit 6 supplies the precharged voltage VPR to the bit lines BL, BLB so as to equalize these bit lines BL, BLB. Accordingly, all the nodes of the sense amplifier AMP are at the precharged voltage VPR, so that the sense amplifier AMP is kept inactivated.

Thereafter, when address signals, a read/write signal or the like are inputted to the DRAM from outside, the DRAM starts the read cycle. The decoding signal WDEC is changed from a low level to a high level in accordance with the input of the row address signals. Besides, the timing generator 16 brings the precharging timing signal PRT to a low level and the sense amplifier timing signal SAT to a high level.

Upon receiving the precharging timing signal PRT, the PR generator 17 brings the precharging signal PR to the low level (VSS) (FIG. 4(a)). Subsequently, upon receiving the low level of the precharging signal PR, the precharging circuit 6 stops supplying the precharged voltage VPR to the bit lines BL, BLB so as to stop equalizing these bit lines BL, BLB. Then, the precharge operation of the bit lines BL, BLB is completed.

Upon receiving the low level of the precharging signal PR, the nMOS's 12, 13 of the sense amplifier driver 5 are turned off, thereby to stop supplying the precharged voltage VPR as the sense amplifier driving signals VP, VN.

Subsequently, the word line WL0 becomes the high level (VPP), and the cell transistor TR0 of the memory cell MC0 is turned on (FIG. 4(b)). The stored charges of the memory cell MC0 are shared by the bit line BL, and the voltage of this bit line BL rises (FIG. 4(c)). The bit line BLB is kept at the level of the precharged voltage PR, which is used as a reference voltage (FIG. 4(d)).

Subsequently, upon receiving the decoding signal WDEC and the sense amplifier timing signal SAT, the SA generator 18 shown in FIG. 3 brings the activating signal SAB0 to a low level and the activating signal SA0 to a high level. Further, the CMOS inverter 20 having received the low level of the activating signal SAB0 turns on the nMOS 20b, thereby to output the ground voltage VSS as the sense amplifier activating signal SAB (FIG. 4(e)). Likewise, the CMOS inverter 21 having received the high level of the activating signal SA0 turns on the pMOS 21a, thereby to output the internal supply voltage Vii as the sense amplifier activating signal SA (FIG. 4(f)).

Upon receiving the low level (VSS) of the sense amplifier activating signal SAB, the pMOS 11 of the sense amplifier driver 5 shown in FIG. 2 is turned on, thereby to supply the internal supply voltage Vii as the sense amplifier driving signal VP. Also, upon receiving the high level (Vii) of the sense amplifier activating signal SA, the nMOS 14 of the sense amplifier driver 5 is turned on, thereby to supply the ground voltage VSS as the sense amplifier driving signal VN.

The sense amplifier AMP is activated in accordance with the fact that the sense amplifier driving signals VP and VN become the high level and the low level, respectively. Then, the bit lines BL, BLB are differentially amplified until the voltage of the bit line BL is changed to the internal supply voltage Vii and that of the bit line BLB is changed to the ground voltage VSS (FIG. 4(g)).

The amplified voltage of the bit lines BL, BLB is transferred as an I/O signal through a column switch (not shown) which is controlled by the column decoder (not shown), and is outputted from the output buffer (not shown) to outside the DRAM.

Thereafter, the word line WL0 is brought to the low level (VMI), the sense amplifier activating signals SA and SAB are respectively brought to the low level (VSS) and the high level (Vii), and the precharging signal PR is brought to the high level (VPP) (FIG. 4(h)). Then, the sense amplifier AMP is inactivated, and the read cycle is completed.

Incidentally, also in case of a write cycle, the sense amplifier AMP is activated in the same way as in the read cycle. Besides, the bit lines BL, BLB are brought to the internal supply voltage Vii or the ground voltage VSS, thereby to write data into the memory cell MC0.

Meanwhile, the size dispersion of the sense amplifiers AMP needs to be prevented in order that data written in the memory cells MC may be accurately amplified by the sense amplifiers AMP. In the production of a semiconductor integrated circuit, there are a large number of fabrication processes which form the factors of size dispersion, and especially a lithography process is apt to incur the size dispersion. In the DRAM, the size dispersion of the sense amplifiers AMP becomes causes for the increase of an access time, the narrowed range of operating voltages, malfunctions, or the like, and seriously affects the yield of the manufactured articles of the DRAM. In general, therefore, the size dispersion is suppressed by setting the channel lengths, or the like of the constituent devices of each sense amplifier AMP to be greater as compared with those of the other devices.

This tendency holds true also of a product in which device sizes are made smaller every generation so as to achieve a reduced chip size and a heightened operating speed.

On the other hand, as shown in FIG. 1, the sense amplifiers AMP of the DRAM are constructed as the sense amplifier rows 3 and are arranged around the memory cell arrays 2. Therefore, when the sense amplifier rows 3 each being configured of the sense amplifiers AMP can not be accommodated on both the sides of any of the memory cell arrays 2, the number of the sense amplifiers AMP of the sense amplifier rows 3 is decreased in some cases. By way of example, on account of the decrease in the number of the sense amplifiers AMP, the sense amplifier row 3 at the right end is used to amplify the four memory cell arrays 2 on the left side.

As a result, the lengths of the bit lines BL, BLB connected to one sense amplifier AMP enlarge, and then increase the capacitance of these bit lines. Since the amplifying speed of the sense amplifier AMP lowers due to the increases in the bit line capacitance, the access time cannot be considerably shortened in spite of the product of reduced device sizes.

Here, the drivability of the sense amplifier AMP may be enhanced in order to shorten the access time without lowering the amplifying speed of the sense amplifier AMP.

As a method for enhancing the drivability of the sense amplifier, it is considered by way of example that the sizes of the pMOS 11 and nMOS 14 of the sense amplifier driver 5 shown in FIG. 2 are enlarged to enhance capabilities for feeding the sense amplifier driving signals VP, VN.

Since, however, the sense amplifier driver 5 is arranged in the intersecting region between the sense amplifier rows 3 and the sub word decoder rows 4 as shown in FIG. 1, it cannot be made larger than this region. It is accordingly difficult to enlarge the size of the sense amplifier driving circuit 5.

As another expedient for enhancing the drivability of the sense amplifier AMP, it is considered by way of example that the source of the PMOS 11 of the sense amplifier driver 5 shown in FIG. 2 is supply with a voltage higher than the internal supply voltage Vii, thereby to heighten the voltage of the sense amplifier driving signal VP.

The sense amplifier AMP, however, is activated also in the write mode. With this method, therefore, the voltage of the bit line BL becomes higher than the internal supply voltage Vii when data of high level is to be written into the memory cell MC0. In order to write into the memory cell MC0 a signal amount corresponding to the voltage of the bit line BL, the high level voltage for the word line WL0 must be set higher than the write voltage of the bit line BL by, at least, the threshold voltage of the cell transistor TR0. To heighten the high level voltage for the word line WL0, however, leads to degradation in the reliability of the gate insulator of the memory cell MC0. Moreover, it leads to increase in the power consumption of the chip to heighten the high level voltage of the bit line BL or word line WL0. It is accordingly very difficult and demeritorious to heighten the voltage of the sense amplifier driving signal VP.

On the other hand, in order to attain a lower power consumption, a recent DRAM generates an internal power supply lower in voltage than an external power supply and uses the lowered internal power supply as a power supply for memory cells, that is, the driving power supply of sense amplifiers. In other words, the high level of bit lines is set at the voltage (Viic) of the lowered internal power supply, whereby the driving power of the bit lines can be lowered to suppress voltages in the memory cells.

However, even when the internal supply voltage Viic is set low, the threshold voltages of the transistors of the sense amplifier or the like do not considerably differ from those in the prior art. Accordingly, the drivability of the sense amplifier lowers with the lowering of the internal supply voltage Viic, to incur the problem that the amplifying speed of the amplifier cannot be heightened. In order to solve such a problem, a sense amplifier of an overdriving system has been proposed.

FIG. 5 shows an example of the general configuration of DRAMs. A memory cell MC is configured of an NMOS transistor Qs and a capacitor Cs, and is arranged at the intersection area between a word line WL and bit lines BL, /BL. In the read or write operation of the memory cell MC, a sense amplifier SA detects and amplifies the small voltage difference between the bit lines BL, /BL. As described before, it is requested to lower the voltage of a cell power supply and to heighten the operating speed of the memory. The overdriving sense amplifier system has therefore been proposed as the drive system of the sense amplifier.

FIG. 6 is a timing chart showing the principle of the overdriving sense amplifier system. The precharge operation of the bit lines BL, /BL is performed in the standby state of the memory as explained below. First, owing to the activation (high level) of a bit line controlling signal brs shown in FIG. 5, the bit lines BL, /BL are connected through a transistor N6. Simultaneously, a precharged voltage VPR is supplied to the pair of bit lines through transistors N4, N5. The precharged voltage VPR in this example is set at ½ of the internal supply voltage Viic for the cell (that is, at ½ Viic).

When the memory becomes an active state, the bit line controlling signal brs is inactivated (low level), and a transfer gate controlling signal btl is activated (high level). Thereafter, the word line WL is selected (high level), a voltage corresponding to data held in the memory cell MC is transmitted to the bit lines BL, /BL, and the small voltage difference appears between the bit lines.

Sense amplifier activating signals lep, len are activated (to low and high levels, respectively) at the timing at which the voltage difference appears between the bit lines BL, /BL. Then, a driving voltage Viid is supplied to the sense amplifier SA. The driving voltage Viid is set at an external supply voltage Vdd which is higher than the internal supply voltage Viic. Accordingly, the sense amplifier SA is driven at high speed by the high external supply voltage Vdd, thereby to amplify at high speed the small voltage difference which has appeared between the bit lines BL, /BL.

The driving voltage Vdd of the sense amplifier SA is switched from the external power supply (Vdd) to the internal power supply (Viic) at the timing (a) in FIG. 6 at which the high level side of the bit lines BL, /BL has reached the voltage Viic. As shown in FIG. 6, the rising time and falling time of the bit lines BL, /BL become shorter in the case where the sense amplifier SA is overdriven (as a waveform indicated at symbol OD in the figure), in comparison with a case where it is not overdriven (as a waveform indicated at symbol NOD in the figure). In the former case, therefore, the read operation and write operation of the memory can be performed at high speed.

As explained above, in the sense amplifier SA of the overdriving system, the overdriving operation needs to be stopped by lowering the driving voltage of the sense amplifier SA at the timing (FIG. 6(*a*)) at which the voltage of the high level side of the bit lines BL, /BL has become the internal supply voltage Viic. In the prior art, the timing for stopping the overdriving is controlled by a timing signal which is generated by a CR delay circuit or the like.

FIG. 7 is a timing chart showing a problem involved in the prior art. The internal power supply (Viic) has been lowered in the memory, and has a stable voltage level. The external supply voltage Vdd for use as the overdriving voltage has a voltage fluctuation which is larger as compared with that of the internal supply voltage Viic. With the prior art method of stopping the overdriving by the time control of the delay circuit, therefore, the overdriving might be excessively applied as shown in FIG. 7 in a case where the sense amplifier SA is overdriven under the high level state of the external supply voltage Vdd. In this case, the sense amplifier SA is excessively driven, and the high level of the bit lines BL, /BL becomes as indicated by broken lines.

In such a case, the next precharge operation is performed in the state in which the voltage of the high level side of the bit lines BL, /BL has become high. In the precharge operation, a bit line precharging circuit BLPR shown in FIG. 5 operates. Owing to the operation, the pair of bit lines are short-circuited and come to have the precharged voltage VPR. Even when the high level voltage of the bit lines BL, /BL has increased to some extent, it can be lowered by a precharged voltage generator not shown. However, in a case where the increment of the high level voltage has exceeded the capability of the precharged voltage generator, the precharged level of the bit lines BL, /BL becomes higher than the voltage Viic/2 as indicated at a level V1 in FIG. 7. As a result, the bit line voltage on the high level side rises little in the subsequent read operation, to incur the problem that the data of the high level cannot be accurately read out.

SUMMARY OF THE INVENTION

An object of the present invention is to provide a semiconductor integrated circuit in which the drivability of a sense amplifier is enhanced to heighten the amplifying speed thereof.

Another object of the present invention is to enhance the drivability of a sense amplifier and heighten the amplifying speed thereof without enlarging the chip size.

Still another object of the present invention is to provide a semiconductor memory device in which a sense amplifier using the overdriving system can be appropriately driven and controlled.

A further object of the present invention is to provide a semiconductor memory device in which a sense amplifier using the overdriving system can be driven and controlled at an appropriate timing even when the voltage of an external power supply has fluctuated.

According to one of the aspects of the present invention, the semiconductor integrated circuit comprises a controlling circuit, a driver including a transistor, and a sense amplifier. The transistor of the driver has its gate connected to the controlling circuit, and has its drain connected to the sense amplifier. The controlling circuit supplies the gate of the transistor with a gate-to-source voltage exceeding or below other supply voltages. The drain-to-source resistance of the transistor in the on state becomes sufficiently lower as compared with that in the case of supplying the supply voltages between the gate and source of the transistor, wherein supply voltages are, for example, power supply voltages. Therefore, a large quantity of carriers is supplied from the source to the drain of the transistor. The sense amplifier is activated by being supplied with the carriers from the drain, thereby to amplify a signal.

Accordingly, the amplifying speed of the sense amplifier is heightened without altering the sense amplifier and the driver. Besides, the amplifying speed of the sense amplifier is heightened without raising the supply voltage which supplies the carriers to the driver.

In a case where the amplifying speed of the sense amplifier need not be heightened, the driver for the sense amplifier or the sense amplifier itself can be reduced in size.

According to another aspect of the present invention, the semiconductor integrated circuit comprises a plurality of rectangular memory cell arrays in each of which memory cells are arranged vertically and horizontally. A bit line is connected to the plurality of memory cells in the memory cell array which are aligned in one direction. A plurality of word decoders is juxtaposed between the sides of the two adjacent memory cell arrays, in a direction parallel to the bit lines. A plurality of sense amplifiers is juxtaposed between the sides of the two adjacent memory cell arrays, in a direction perpendicular to the bit lines. Drivers for driving the sense amplifier rows are arranged in regions where the alignments running in the direction that the word decoders and that of the sense amplifiers are juxtaposed in intersect.

A controlling circuit supplies the gates of the transistors of the drivers with a gate-to-source voltage exceeding or below other supply voltages. Accordingly, the amplifying speeds of the sense amplifiers are heightened without altering the sense amplifiers and the drivers which are arranged around the memory cell arrays. In other words, it is permitted to heighten the amplifying speeds of the sense amplifiers without enlarging the chip size.

In a case where the amplifying speeds of the sense amplifiers need not be heightened, the drivers for the sense amplifiers or the sense amplifiers themselves can be reduced in size, and the chip size can be reduced.

According to another aspect of the present invention, the semiconductor integrated circuit includes, a pMOS transistor included in the driver, and the transistor is controlled on by the controlling circuit supplying the gate of the pMOS transistor with negative voltage. The drain-to-source resistance of the pMOS transistor in the on state becomes sufficiently lower as compared with that in the case of supplying a ground voltage to the gate of the transistor. Therefore, the amplifying speed of the sense amplifier is heightened.

According to another aspect of the present invention, the semiconductor integrated circuit comprises memory cells, a word line which is connected to the memory cells, and a negative voltage generator which generates negative voltage that is to be supplied to the word line. The controlling circuit controls the supplying of the negative voltage generated by the negative voltage generator to the gate of the pMOS transistor included in the driver. It is therefore no longer necessary to dispose a new negative voltage generator for the purpose of controlling the pMOS transistor. As a result, the amplifying speed of a sense amplifier is heightened without enlarging the chip size of the semiconductor integrated circuit.

According to another aspect of the present invention, the semiconductor integrated circuit comprises a substrate voltage generator which generates negative voltage that is to be supplied to the substrate (p-well) of an nMOS transistor. A controlling circuit controls supplying the negative voltage generated by the substrate voltage generator to the gate of a pMOS transistor. It is therefore no longer necessary to dispose a new negative voltage generator for the purpose of the control of the pMOS transistor. As a result, the amplifying speed of a sense amplifier is heightened without enlarging the chip size of the semiconductor integrated circuit.

According to another aspect of the present invention, the semiconductor integrated circuit includes a nMOS transistor included in the driver, and the transistor is controlled on by the controlling circuit supplying the gate of the nMOS transistor with high voltage. The drain-to-source resistance of the nMOS transistor in the on state becomes sufficiently lower as compared with that in the case of supplying a supply voltage to the gate. Therefore, the amplifying speed of a sense amplifier is heightened.

According to another aspect of the present invention, the semiconductor integrated circuit comprises memory cells, a word line which is connected to the memory cells, and a high voltage generator which generates a high voltage that is to be supplied to the word line. The controlling circuit controls the supplying of the high voltage generated by the high voltage generator to the gate of the nMOS transistor included in the driver. It is therefore no longer necessary to dispose a new high voltage generator for the purpose of controlling the nMOS transistor. As a result, the amplifying speed of a sense amplifier is heightened without enlarging the chip size of the semiconductor integrated circuit.

Besides, in order to accomplish the above objects, a semiconductor memory device according to the present invention switches a driving power supply for a sense amplifier from a first power supply generating a first supply voltage, to a second power supply generating a second supply voltage lower than the first voltage. Thus, the sense amplifier is overdriven during, at least, the initial time period. The timing at which the first supply voltage is switched to the second supply voltage is controlled in accordance with the voltage on a dummy bit line which is driven by a monitoring sense amplifier. More specifically, the driving power supply of the sense amplifier is switched from the first power supply to the second power supply at the timing at which the voltage on the dummy bit line at a high level reaches the voltage of the second supply voltage. Accordingly, even when the driving speed of the sense amplifier using the overdriving system has fluctuated due to the fluctuation of the voltage of the first supply voltage, the driving power supply of the sense amplifier can always be switched to the second power supply at the appropriate timing.

Further, in order to accomplish the above objects, a semiconductor memory device according to the present invention comprises a first power supply generating the first supply voltage, a second power supply generating the second supply voltage which is lower than the first supply voltage, a sense amplifier which is connected to a memory cell through a bit line so as to amplify a bit line voltage, and a sense amplifier controlling circuit. When the sense amplifier has been activated, the sense amplifier controlling circuit connects the first power supply to the sense amplifier during a first time period, and then connects the second power supply to the sense amplifier during a second time period. Here, the sense amplifier controlling circuit includes a monitoring sense amplifier which amplifies the voltage on a dummy bit line in response to the activation of the sense amplifier. Thus, when the sense amplifier has been activated, the driving power supply of the sense amplifier is switched from the first power supply to the second power supply in accordance with the voltage on the dummy bit line.

Still further, in order to accomplish the above objects, a semiconductor memory device according to the present invention comprises a first power supply generating the first supply voltage, a second power supply generating the second supply voltage which is lower than the first supply voltage, a sense amplifier which is connected to memory cells through a bit line so as to amplify the bit line voltage, and a sense amplifier controlling circuit. When the sense amplifier has been activated during an active period, the sense amplifier controlling circuit connects the first power supply to the sense amplifier during a first time period, and then connects the second power supply to the sense amplifier during a second time period. Here, the sense amplifier controlling circuit supplies the first supply voltage to the sense amplifier during the standby period after the active period.

According to the foregoing semiconductor memory device, during the standby period, the sense amplifier need not be kept supplied the second supply voltage, but it only needs to be kept supplied the first supply voltage having high voltage and utilizing external power supply or the like, so that power consumption during the standby period can be lowered.

BRIEF DESCRIPTION OF THE DRAWINGS

In the accompanying drawings:

FIG. 26 is diagrams for explaining examples of the internal power supply circuit;

DESCRIPTION OF THE PREFERRED EMBODIMENTS

Now, the embodiments of the present invention will be described in detail with reference to the drawings.

Figure 8:
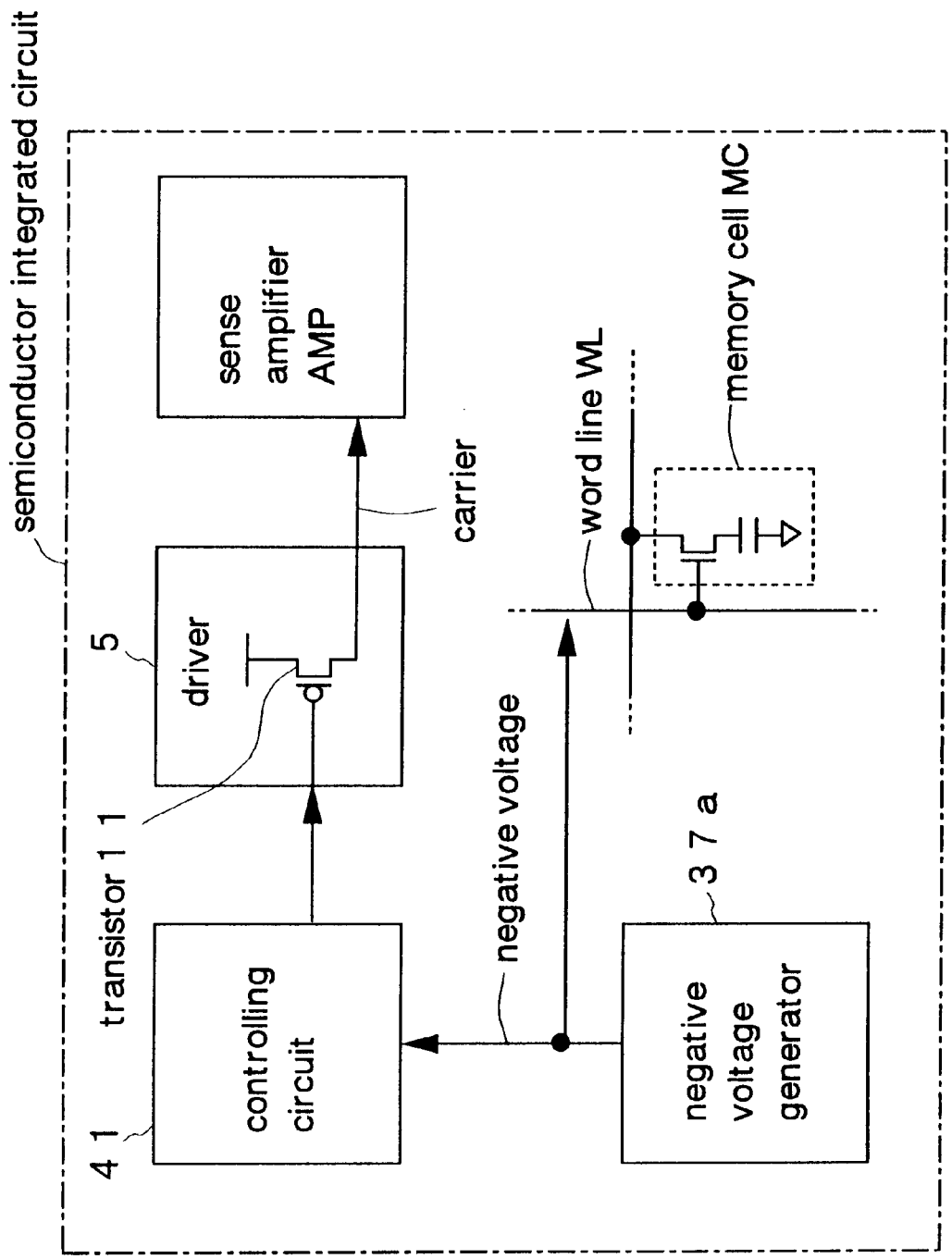
FIG. 8 is a block diagram showing the basic principle of the semiconductor integrated circuit according to the present invention.

FIG. 8 is a block diagram showing the basic principles of a semiconductor integrated circuit according to the present invention.

The semiconductor integrated circuit of the present invention comprises a controlling circuit 41, a driver 5 including a transistor 11, and a sense amplifier AMP. The transistor 11 of the driver 5 has its gate connected to the controlling circuit 41, and has its drain connected to the sense amplifier AMP. The controlling circuit 41 supplies the gate of the transistor 11 with a gate-to-source voltage exceeding or below other supply voltages, thereby to control on the transistor 11.

Another semiconductor integrated circuit according to the present invention includes a pMOS transistor 11 in the driver 5. The controlling circuit 41 supplies the gate of the pMOS transistor 11 with negative voltage, thereby to control on the transistor 11.

Still another semiconductor integrated circuit according to the present invention comprises a memory cell MC, a word line WI which is connected to the memory cell MC, and a negative voltage generator 37a which generates negative voltage that is to be supplied to the word line WL. The controlling circuit 41 controls supplying the negative voltage generated by the negative voltage generator 37a, to the gate of the pMOS transistor 11 included in the driver 5.

Figure 9:
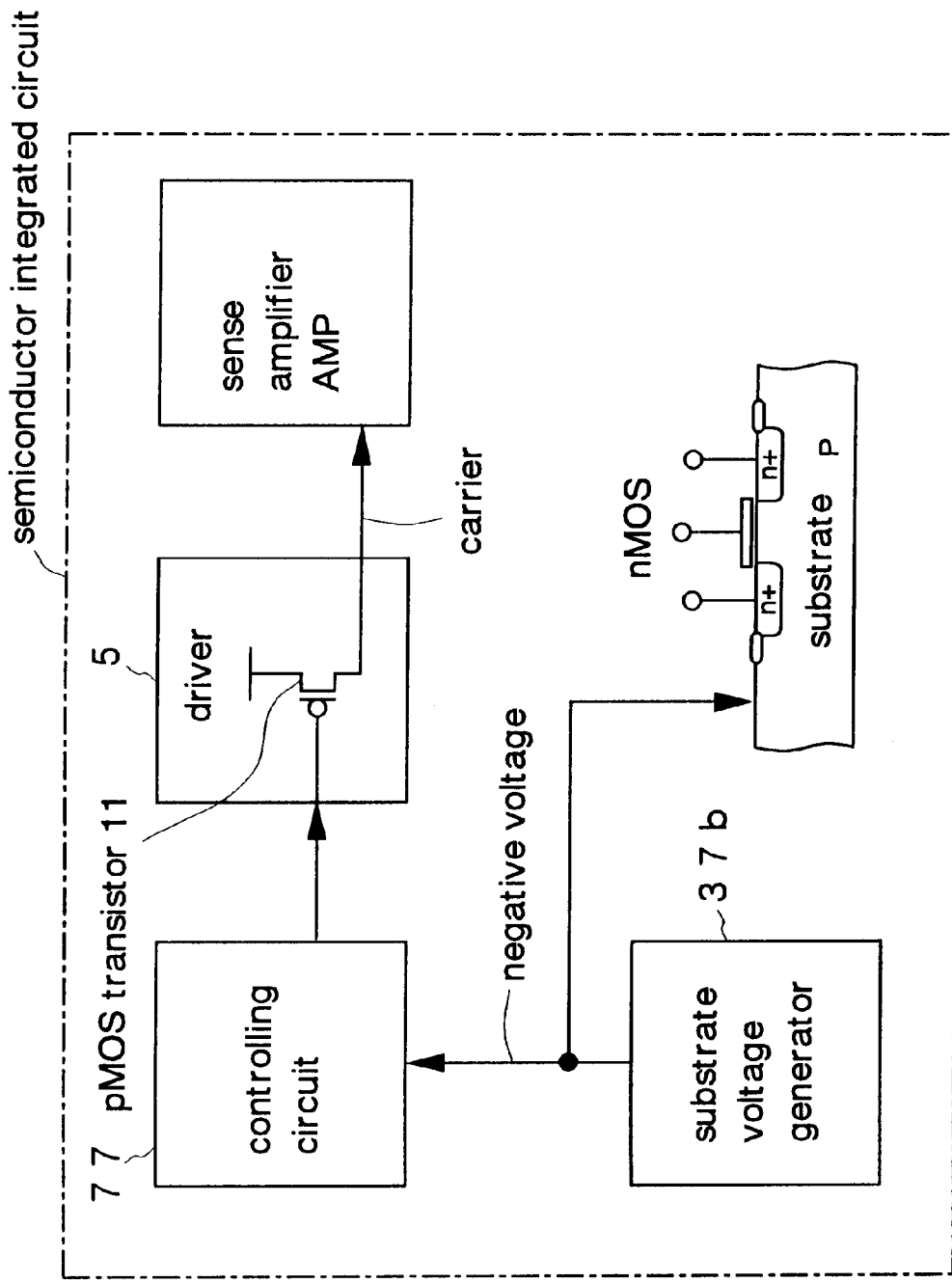
FIG. 9 is a block diagram showing the basic principle of another semiconductor integrated circuit according to the present invention.

FIG. 9 is a block diagram showing the basic principles of another semiconductor integrated circuit according to the present invention.

The semiconductor integrated circuit comprises a substrate voltage generator 37b which generates negative voltage that is to be supplied to the substrate (p-well) of an nMOS transistor. A controlling circuit 77 controls supplying the negative voltage generated by the substrate voltage generator 37b, to the gate of a pMOS transistor 11.

Figure 10:
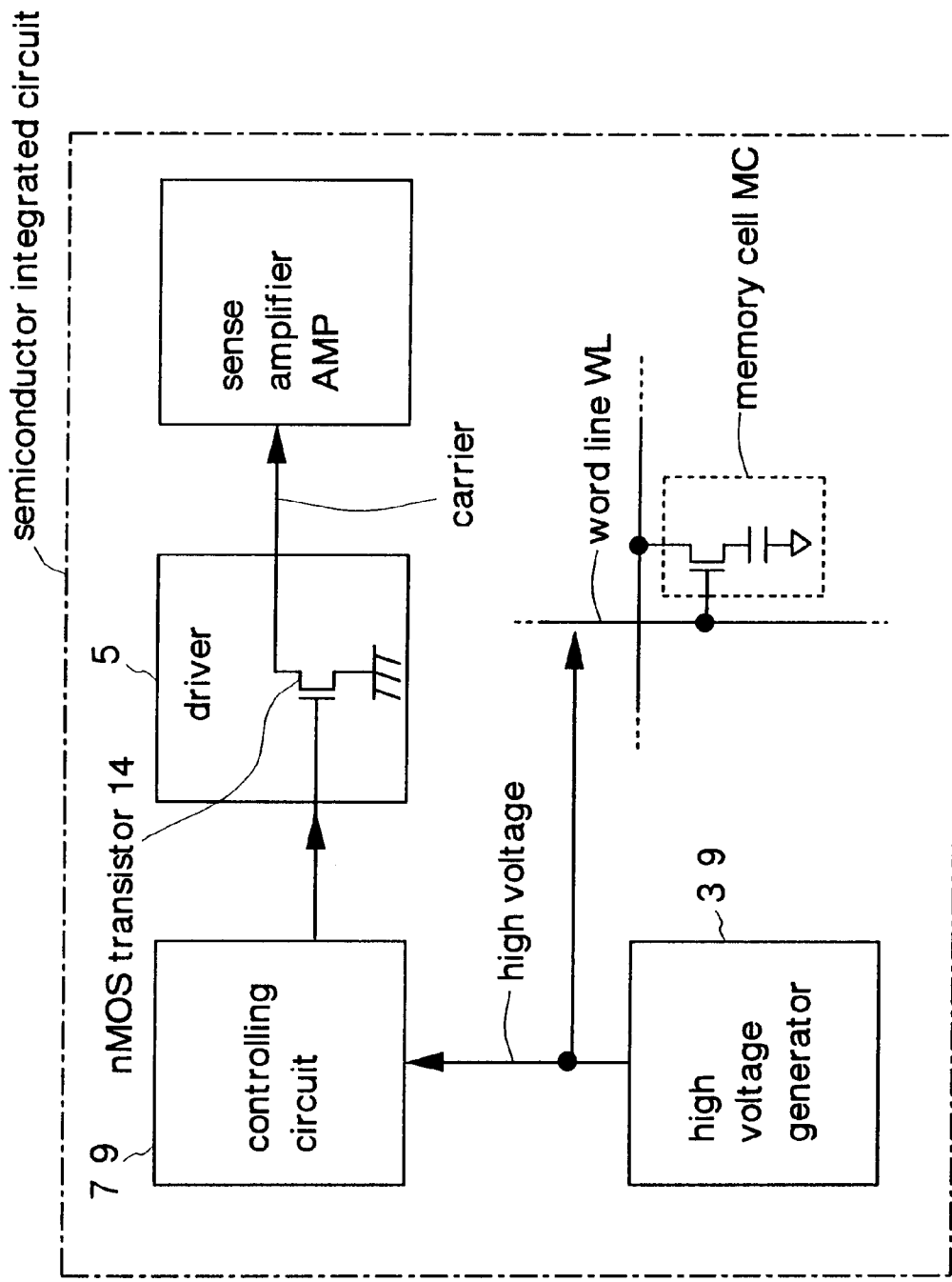
FIG. 10 is a block diagram showing the basic principle of still another semiconductor integrated circuit according to the present invention.

FIG. 10 is a block diagram showing the basic principles of still another semiconductor integrated circuit according to the present invention.

The semiconductor integrated circuit includes an nMOS transistor 14 in a driver 5. A controlling circuit 79 supplies a high voltage to the gate of the nMOS transistor 14, thereby to control on this transistor.

Another semiconductor integrated circuit comprises a memory cell MC, a word line WL which is connected to the memory cell MC, and a high voltage generator 39 which generates a high voltage that is to be supplied to the word line WL.

Figure 11:
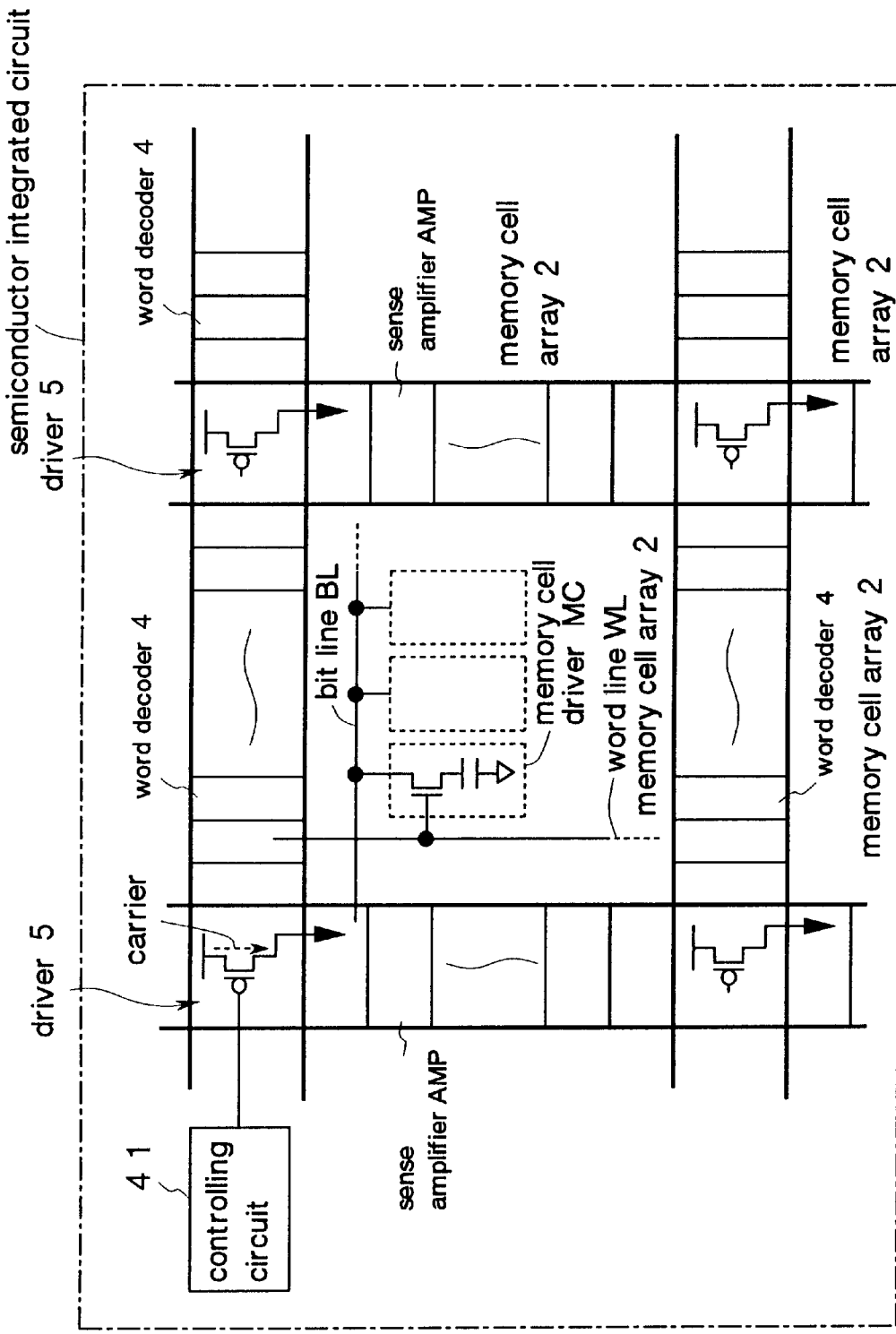
FIG. 11 is a block diagram showing the basic principle of yet another semiconductor integrated circuit according to the present invention.

FIG. 11 is a block diagram showing the basic principles of yet another semiconductor integrated circuit according to the present invention.

The semiconductor integrated circuit comprises a plurality of rectangular memory cell arrays 2 in each of which memory cells MC are arranged vertically and horizontally. A bit line BL is connected to the plurality of memory cells MC which are aligned in one direction of the memory cell array 2. A plurality of word decoders 4 are juxtaposed in such a manner that each of them is interposed between those two sides of the respectively adjacent memory cell arrays 2 which are parallel to the bit lines BL. A plurality of sense amplifiers AMP are juxtaposed in such a manner that each of them is interposed between those two sides of the respectively adjacent memory cell arrays 2 which are perpendicular to the bit lines BL. Drivers 5 for driving the sense amplifiers AMP are arranged in regions where the juxtapositional direction of the word decoders 4 and that of the sense amplifiers AMP intersect.

A controlling circuit 41 supplies the gates of the transistors 11 of the drivers 5, with a gate-to-source voltage exceeding or below other supply voltages, thereby to control on the transistors 11.

Figure 12:
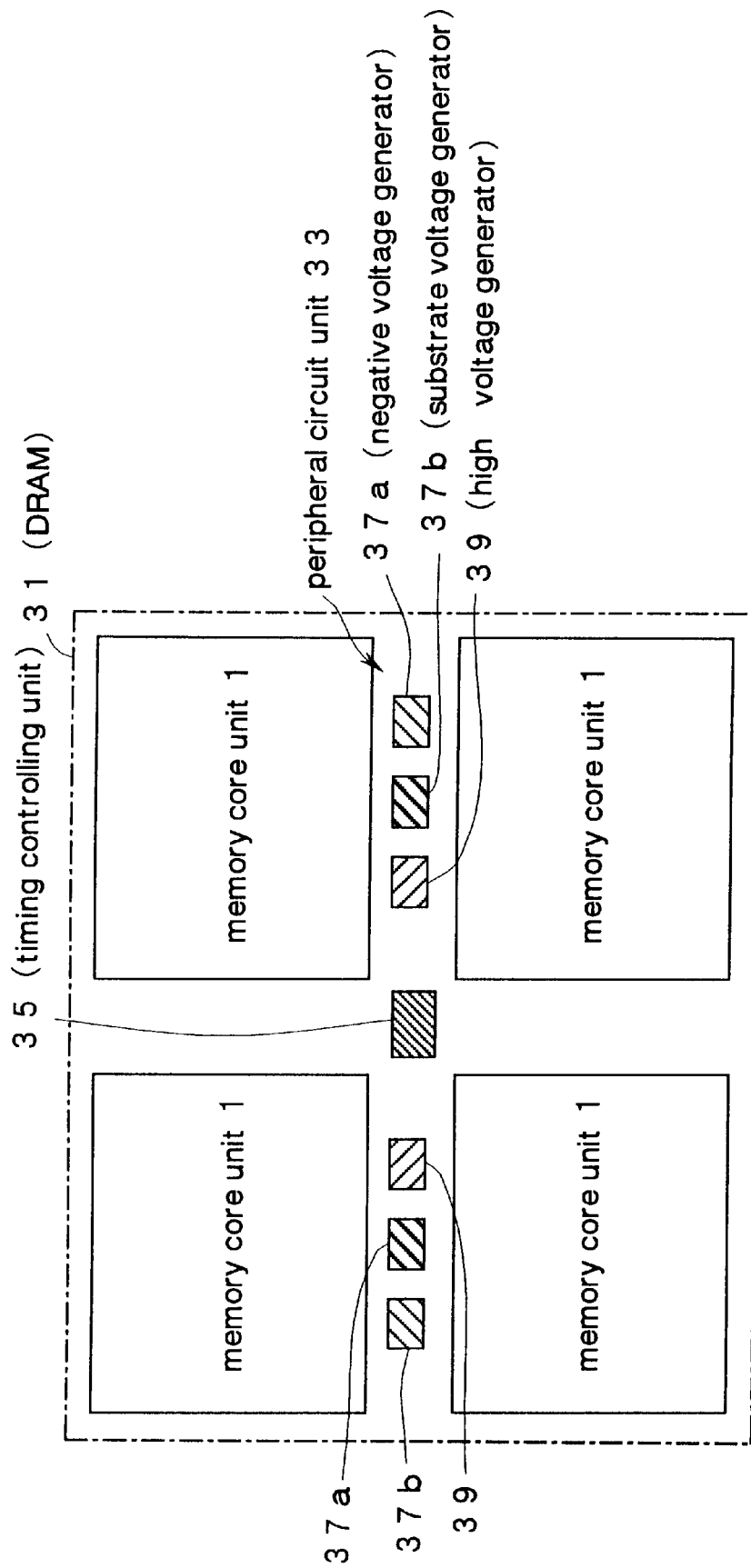
FIG. 12 is an outline showing the first embodiment of the semiconductor integrated circuit according to the present invention.

FIG. 12 shows the first embodiment of a semiconductor integrated circuit according to the present invention. The components and functions same as those mentioned will be indicated by identical reference numbers and the description thereof will be omitted here.

The semiconductor integrated circuit of this embodiment is formed as a DRAM 31 on a silicon substrate by using CMOS process technology.

Four memory core units 1 are arranged in the DRAM 31. A peripheral circuit unit 33 is formed in the shape of a cross among the memory core units 1. A timing controlling unit 35 is arranged centrally of the peripheral circuit unit 33. Besides, a negative voltage generator 37a, a substrate voltage generator 37b and a high voltage generator 39 are arranged in the peripheral circuit unit 33. The negative voltage generator 37a is a circuit for generating a resetting voltage VMI which is the low level voltage of a word line WL. The substrate voltage generator 37b is a circuit for generating a substrate voltage VBB (negative voltage) which is supplied to the substrate of nMOS's. The high voltage generator 39 is a circuit for generating a boost voltage VPP which is the high level voltage for the word line WL. In addition to the circuits mentioned above, pads, an input/output buffer, a main word decoder, a column decoder, or the like, which are not shown, are arranged in the peripheral circuit unit 33.

Figure 1:
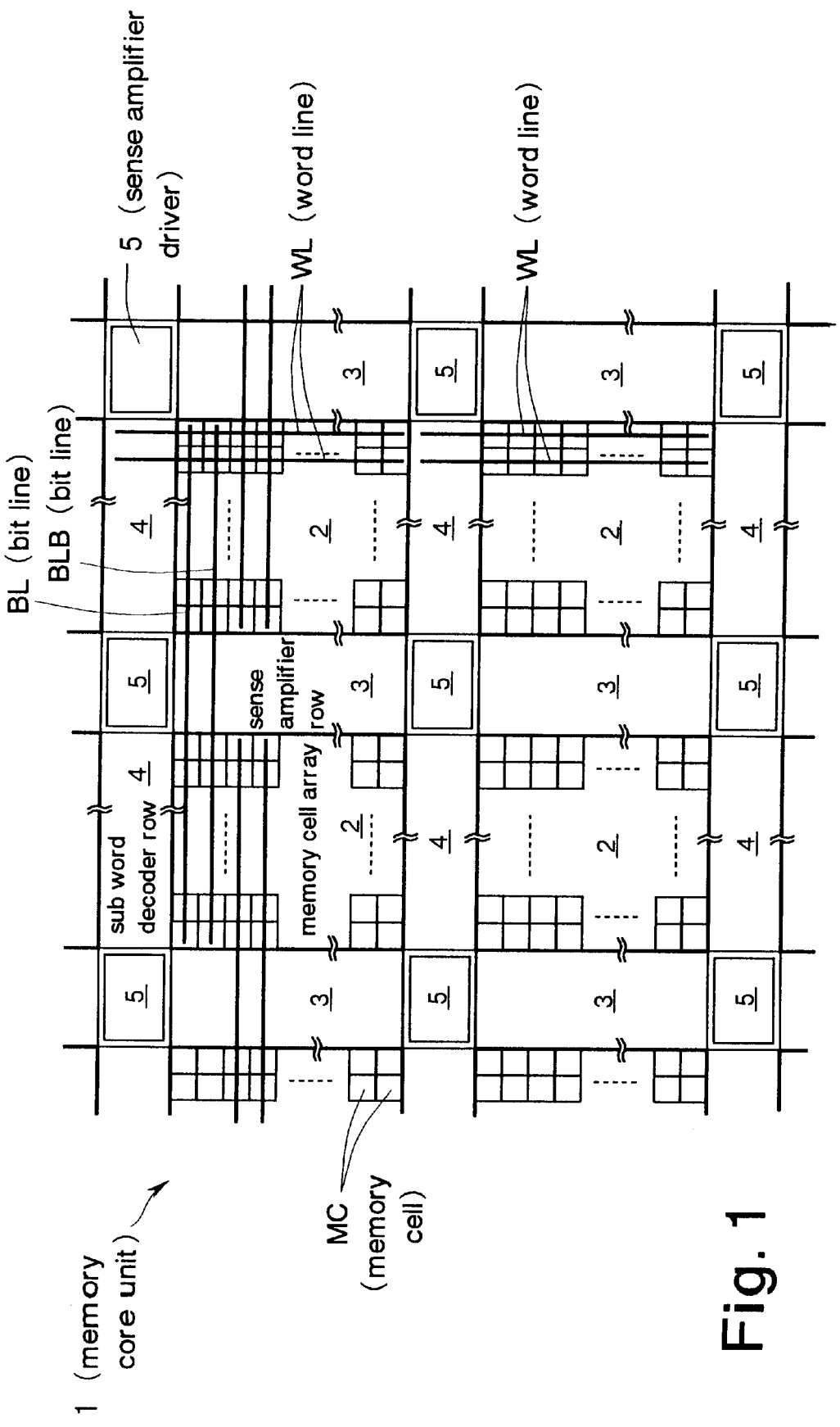
FIG. 1 is an outline showing a memory core unit of DRAMs in the prior art.

Each of the memory core units 1 is the same as shown in FIG. 1, and includes memory cell arrays 2, sense amplifier rows 3, sub word decoder rows 4 (corresponding to word decoders), and sense amplifier drivers 5 (corresponding to drivers).

Figure 13:
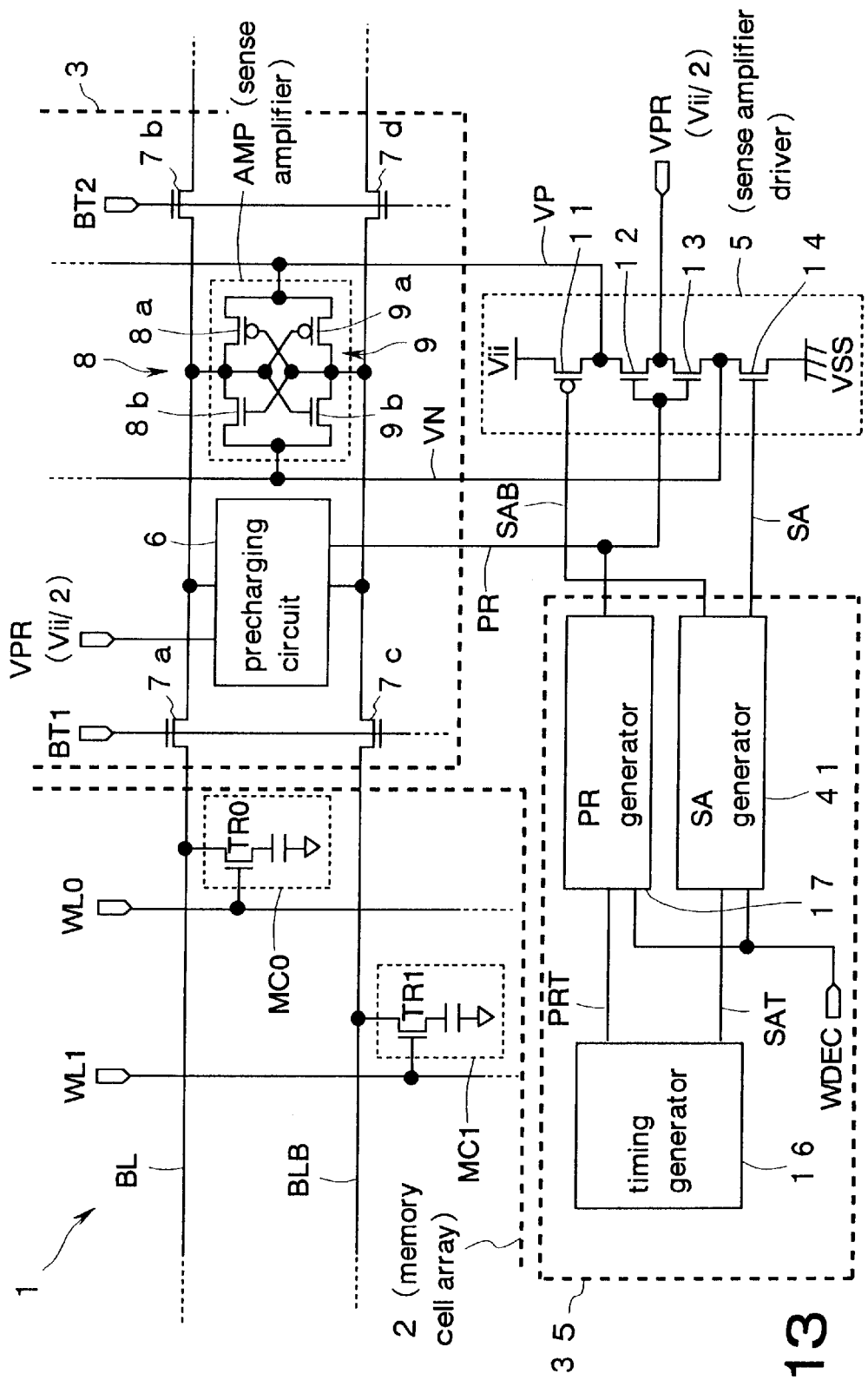
FIG. 13 is a circuit diagram showing the memory core unit and the timing controlling unit of FIG. 12.

FIG. 13 shows the details of the memory core unit 1 and the timing controlling unit 35.

Figure 2:
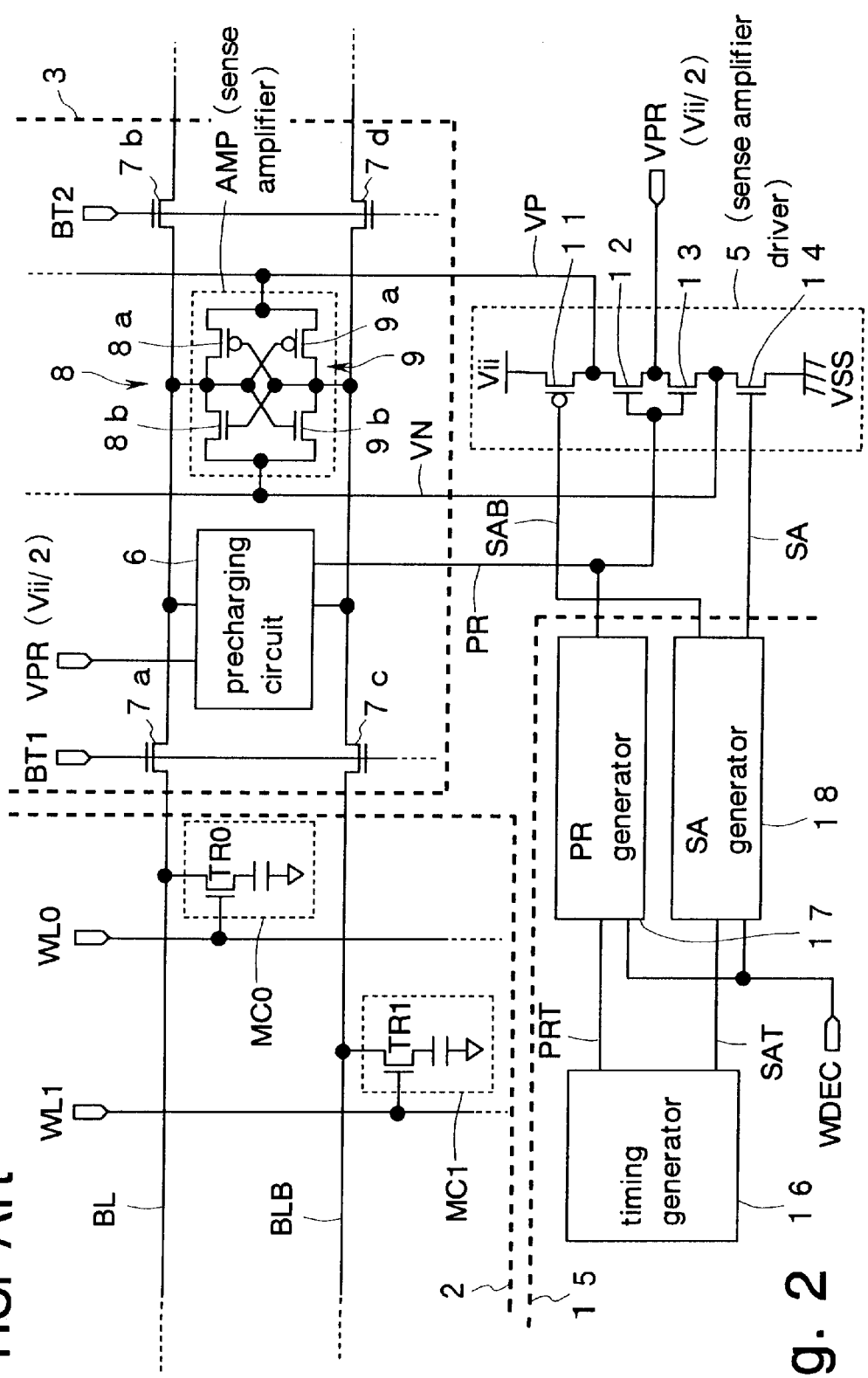
FIG. 2 is a circuit diagram showing a memory core unit and a peripheral circuit unit in the prior art.

The memory cell array 2 has the same configuration as in FIG. 2, and includes a plurality of memory cells MC0, MC1.

The sense amplifier row 3 has the same configuration as in FIG. 2, and includes a plurality of sense amplifiers AMP, a precharging circuit 6, and nMOS's 7a, 7b, 7c, 7d. The sense amplifier AMP is the same circuit as in FIG. 2. The sense amplifier driver 5 is the same circuit as in FIG. 2, and is constructed by connecting a pMOS 11 and three nMOS's 12, 13, 14 in series. In this embodiment, an internal supply voltage Vii is set at 2.0 V, and is generated by lowering a supply voltage VCC (for example, 2.5 V) fed from outside the DRAM. A precharged voltage VPR is a voltage (1.0 V) which is equal to one half of the internal supply voltage Vii.

The timing controlling unit 35 includes a timing generator 16, a PR generator 17 and an SA generator 41 (corresponding to a controlling circuit) which are respectively the same as in FIG. 2.

The timing generator 16 generates and outputs a precharging timing signal PRT and a sense amplifier timing signal SAT.

The PR generator 17 receives the precharging timing signal PRT and a decoding signal WDEC for a row address, and outputs a precharging signal PR which becomes a low level at the activation of the sense amplifier AMP.

The SA generator 41 receives the sense amplifier timing signal SAT and the decoding signal WDEC, and outputs sense amplifier activating signals SAB, SA.

Figure 3:
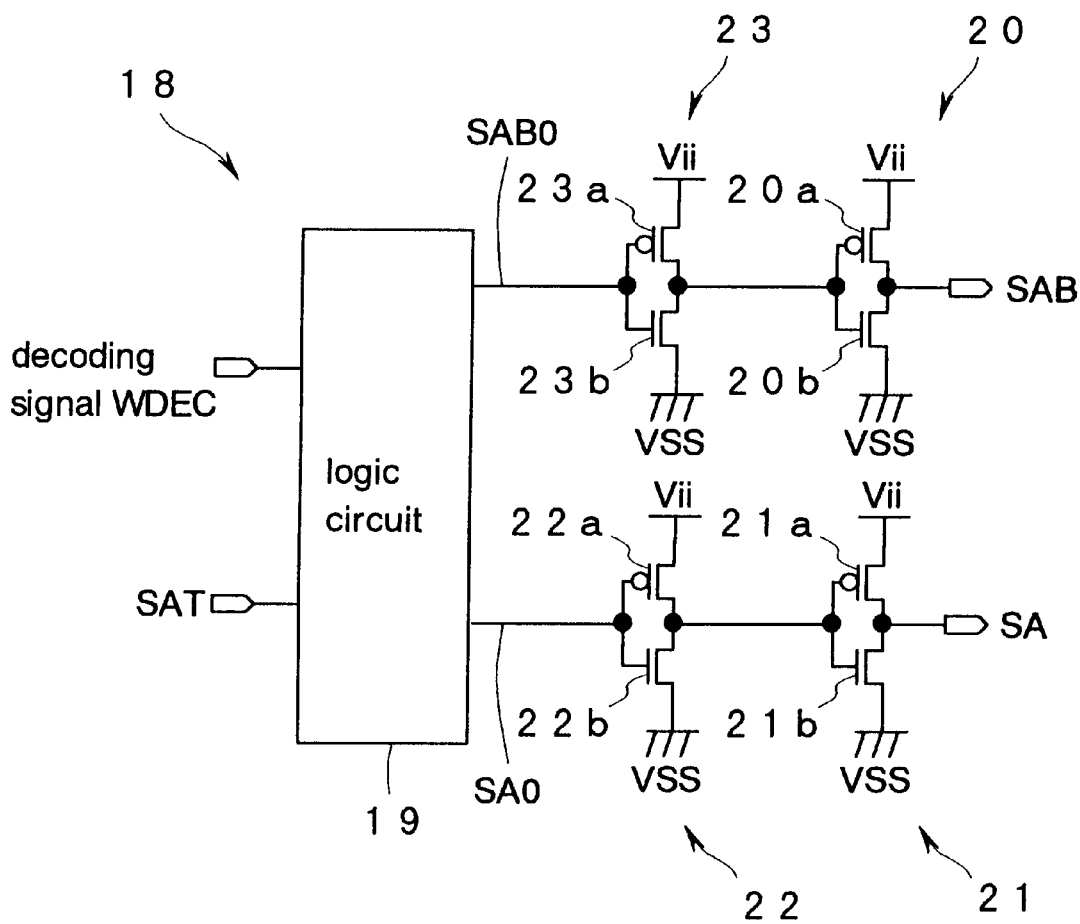
FIG. 3 is a circuit diagram showing the details of the SA generator in the prior art.
Figure 4:
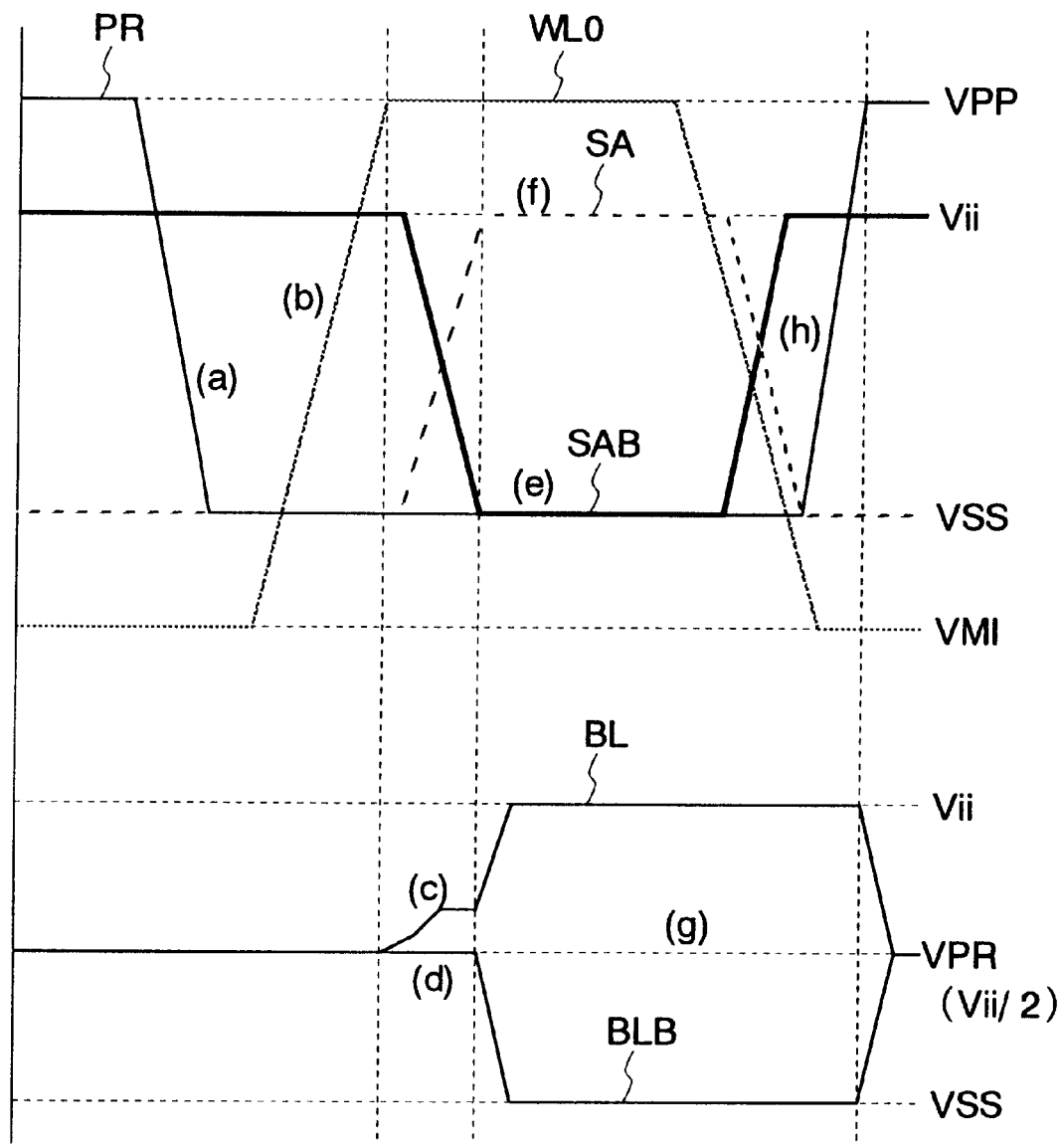
FIG. 4 is a timing chart showing of the principal signals in the read cycle in the prior art.
Figure 14:
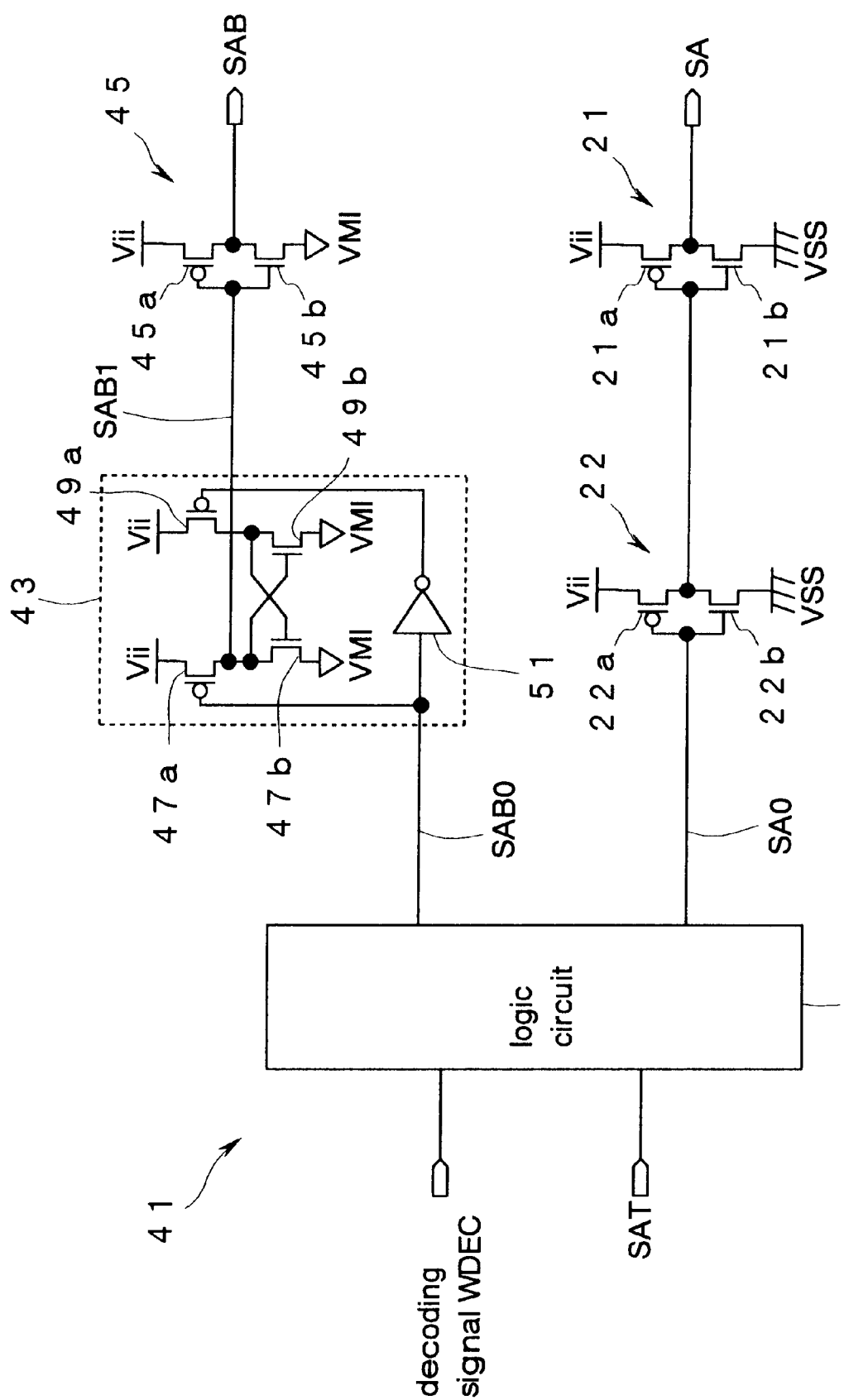
FIG. 14 is a circuit diagram showing the details of the SA generator of FIG. 13.

As shown in FIG. 14, the SA generator 41 is configured of a logic circuit 19, a level shifter 43, and CMOS inverters 45, 21, and 22. The logic circuit 19 and the CMOS inverter 21 are the same circuits as shown in FIG. 3, and the activating signal SA0 of the sense amplifier AMP as outputted from the logic circuit 19 is fed to the CMOS inverter 22. The CMOS inverter 21 outputs the activating signal SA0 as the sense amplifier activating signal SA.

The level shifter 43 is configured of a pMOS 47a and an nMOS 47b connected in series, a pMOS 49a and an nMOS 49b connected in series, and an inverter 51. The sources of the pMOS's 47a, 49a are supplied with the internal supply voltage Vii. The sources of the nMOS's 47b, 49b are supplied with the resetting voltage VMI (−0.5 V) of the word line WL. An activating signal SAB0 from the logic circuit 19 is applied to the gate of the pMOS 47a, while a signal obtained by inverting the activating signal SAB0 by means of the inverter 51 is applied to the gate of the pMOS 49a. The drain of the nMOS 49b is connected to the gate of the nMOS 47b, while the drain of the nMOS 47b is connected to the gate of the nMOS 49b. The activating signal SAB1 of the sense amplifier AMP is outputted from the drain of the pMOS 47a.

The source of a pMOS 45a constituting the CMOS inverter 45 is supplied with the internal supply voltage Vii, and that of an nMOS 45b with the resetting voltage VMI. The CMOS inverter 45 inverts the activating signal SAB1, and outputs the sense amplifier activating signal SAB.

Figure 15:
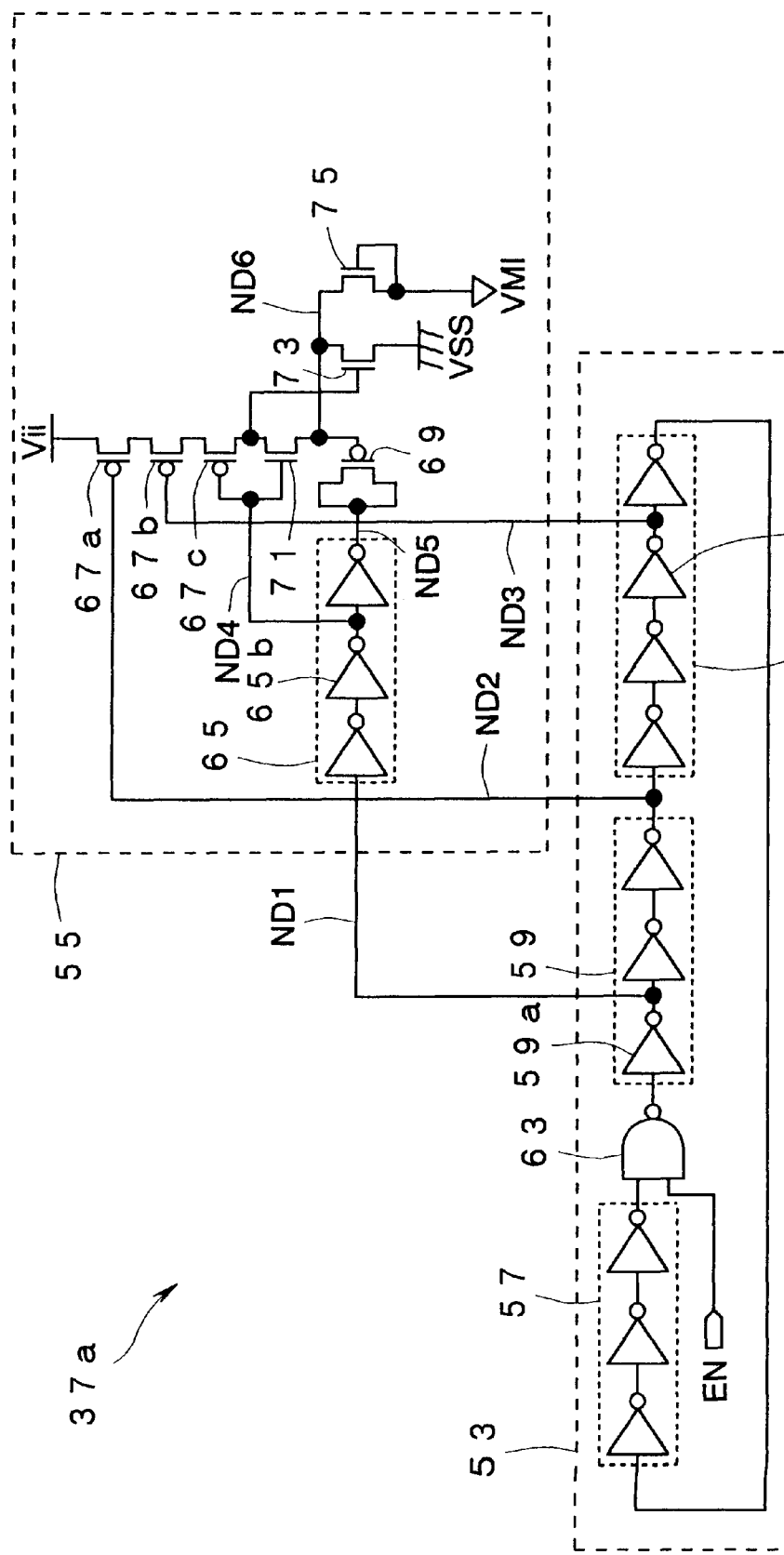
FIG. 15 is a circuit diagram showing the details of the negative voltage generator of FIG. 12.

FIG. 15 shows the details of the negative voltage generator 37a. This negative voltage generator 37a is a circuit for generating the resetting voltage VMI for the word line WL, and includes an oscillator 53 and a pumping circuit 55.

The oscillator 53 is configured of inverter rows 57, 59 in each of which three inverters are connected in cascade, an inverter row 61 in which four inverters are connected in cascade, and a NAND gate 63 which has two inputs. The output node of the inverter row 57 is connected to one input node of the NAND gate 63. The output node of the NAND gate 63 is connected to the input node of the inverter row 59. The output node of the inverter 59a at the first stage of the inverter row 59 is connected to a node ND1. The output node of the inverter row 59 is connected to the input node of the inverter row 61 through a node ND2.

The other input node of the NAND gate 63 is fed with a controlling signal EN. The controlling signal EN is a signal which is outputted from a detector (not shown) for the resetting voltage VMI, and which becomes a high level when the word line WL is to be activated and when the resetting voltage VMI has become a predetermined voltage or above.

The output node of the inverter 61c at the third stage of the inverter row 61 is connected to a node ND3. In addition, the output of the inverter row 61 is fed back to the input node of the inverter row 57. Thus, the oscillator 53 is formed.

The pumping circuit 55 includes an inverter row 65 in which three inverters are connected in cascade, three pMOS's 67a, 67b, 67c which are connected in series, an MOS capacitor 69, and three nMOS's 71, 73, 75. The MOS capacitor 69 is formed by interconnecting the source and drain of a pMOS.

The input node of the inverter row 65 is connected to the node ND1. The output node of the inverter 65b at the second stage of the inverter row 65 is connected to the gates of the pMOS 67c and nMOS 71 through a node ND4. The output node of the inverter row 65 is connected to the source and drain of the capacitor 69 through a node ND5.

The source of the pMOS 67a is supplied with the internal supply voltage Vii. The gate of the pMOS 67a is connected to the node ND2. The gate of the pMOS 67b is connected to the node ND3. The drain of the pMOS 67c is connected to the drain of the nMOS 71. The gate of the capacitor 69 is connected to a node ND6. Connected to the node ND6 are the source of the nMOS 71, the drain of the nMOS 73 and the drain of the nMOS 75. The gate of the nMOS 73 is connected to the drain of the pMOS 67c. The source of the nMOS 73 is grounded (ground voltage VSS). The gate and source of the nMOS 75 are interconnected, and are connected to a conductive pattern (not shown) for supplying the resetting voltage VMI.

With the negative voltage generator 37a, when the controlling signal EN is at the high level, the oscillator 53 generates pulses at the nodes ND1, ND2, ND3, ND4, ND5. Besides, the charge and discharge of the capacitor 69 are repeated by the pulses of the node ND5, and the resetting voltage VMI is brought to the negative voltage by rectification based on the nMOS's 73 and 75.

In the DRAM 31 described above, a read cycle is performed as explained below, in order to read out data of high level written in, for example, the memory cell MC0 of the memory cell array 2 as shown in FIG. 13.

Figure 16:
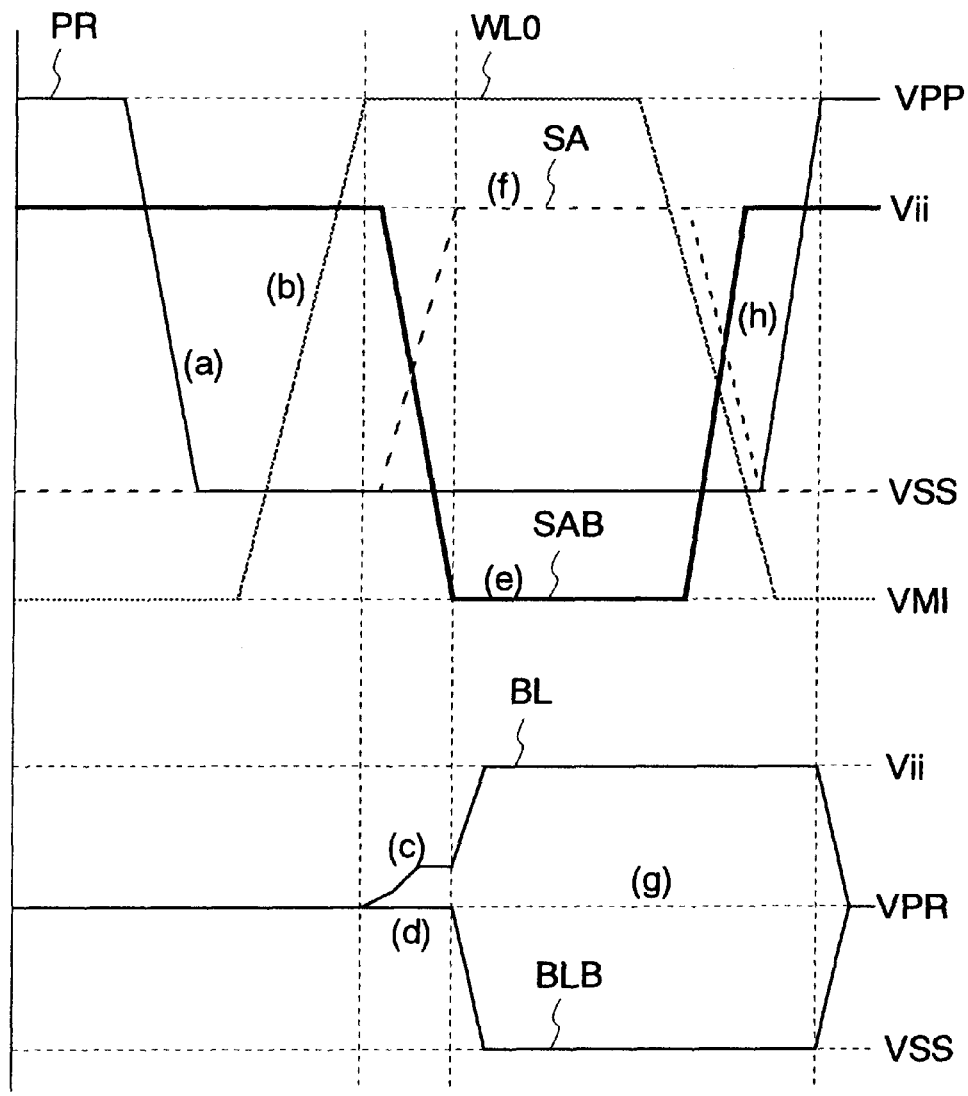
FIG. 16 is a timing chart showing of the principal signals in the read cycle of the first embodiment.

FIG. 16 shows the timings of the principal signals in the read cycle.

Before the read cycle, the precharging signal PR is at a high level (the boost voltage VPP), the word line WL0 is at a low level (the resetting voltage VMI), and the sense amplifier activating signals SA and SAB are at the low level (the ground voltage VSS) and the high level (the internal supply voltage Vii), respectively. On this occasion, the timing generator 16 shown in FIG. 13 holds the timing signal PRT at a high level and the sense amplifier timing signal SAT at a low level. By the way, in this embodiment, the boost voltage VPP is set at 2.9 V, and description will be continued assuming that the "high" data of 2.0 V can be written into the memory cell with the boost voltage.

During the high level of the precharging signal PR, the sense amplifier driver 5 turns on the nMOS's 12, 13, thereby to supply the precharged voltage VPR as the sense amplifier driving signals VP, VN. Also, during the high level of the precharging signal PR, the precharging circuit 6 supplies the precharged voltage VPR to the bit lines BL, BLB so as to equalize these bit lines BL, BLB. Accordingly, all the nodes of the sense amplifier AMP are at the precharged voltage VPR, so that the sense amplifier AMP is kept inactivated.

Thereafter, when address signals, a read/write signal or the like are inputted to the DRAM 31 from outside, the DRAM 31 starts the read cycle. The decoding signal WDEC is changed from a low level to a high level in accordance with the input of the row address signals. Besides, the timing generator 16 brings the precharging timing signal PRT to a low level and the sense amplifier timing signal SAT to a high level.

Upon receiving the precharging timing signal PRT, the PR generator 17 brings the precharging signal PR to the low level (VSS) (FIG. 16(a)). Subsequently, upon receiving the low level of the precharging signal PR, the precharging circuit 6 stops supplying the precharged voltage VPR to the bit lines BL, BLB so as to stop equalizing these bit lines BL, BLB. Then, the precharge operation of the bit lines BL, BLB is completed.

Upon receiving the low level of the precharging signal PR, the nMOS's 12, 13 of the sense amplifier driver 5 are turned off, thereby to stop supplying the precharged voltage VPR as the sense amplifier driving signals VP, VN.

Subsequently, the word line WL0 is brought to the high level (VPP), and the cell transistor TR0 of the memory cell MC0 is turned on (FIG. 16(b)). The stored charges of the memory cell MC0 are shared by the bit line BL, and the voltage of this bit line BL rises (FIG. 16(c)). The bit line BLB is held at the precharged voltage PR, which is used as a reference voltage (FIG. 16(d)).

Subsequently, upon receiving the decoding signal WDEC and the sense amplifier timing signal SAT, the logic circuit 19 of the SA generator 41 shown in FIG. 14 brings the activating signal SAB0 to a low level and brings the activating signal SA0 to a high level.

Upon receiving the low level of the activating signal SAB0, the level shifter 43 brings the activating signal SAB1 to a high level. Further, upon receiving the high level of the activating signal SAB1, the CMOS inverter 45 turns off the pMOS 45a and turns on the nMOS 45b. As a result, the CMOS inverter 45 outputs the resetting voltage VMI (−0.5 V) as the sense amplifier activating signal SAB (FIG. 16(e)). Incidentally, the level shifter 43 is a circuit which brings the low level of the activating signal SAB1 to the resetting voltage VMI. Owing to the level shifter 43, during the low level of the activating signal SAB1, the gate-to-source voltage of the nMOS 45b is held at 0 V, so that an excessive steady-state current is prevented from flowing through the CMOS inverter 45.

Upon receiving the high level of the activating signal SA0, the CMOS inverter 21 turns on the pMOS 21a, thereby to output the internal supply voltage Vii as the sense amplifier activating signal SA (FIG. 16(f)).

Subsequently, upon receiving the low level (−0.5 V) of the sense amplifier activating signal SAB, the pMOS 11 of the sense amplifier driver 5 shown in FIG. 13 is turned on, thereby to supply the internal supply voltage Vii as the sense amplifier driving signal VP. Here, the supply of the internal supply voltage Vii is done by the migration of holes which are majority carriers in the pMOS 11. On this occasion, the gate-to-source voltage of the pMOS 11 becomes −2.5 V. This value is exceeding or below the case of applying 0 V to the gate of the pMOS 11 by 0.5 V. Accordingly, the drain-to-source resistance of the pMOS 11 becomes sufficiently low, and the current density of the sense amplifier driving signal VP increases.

Upon receiving the high level (Vii) of the sense amplifier activating signal SA, the nMOS 14 of the sense amplifier driver 5 is turned on, thereby to supply the ground voltage VSS as the sense amplifier driving signal VN.

The sense amplifier AMP is activated in accordance with the fact that the sense amplifier driving signals VP and VN become the high level and the low level, respectively. Since, on this occasion, a sufficient current is fed as the sense amplifier driving signal VP, the amplifying speed of the sense amplifier AMP is heightened. Then, the bit lines BL, BLB are differentially amplified at high speed until the voltage of the bit line BL and that of the bit line BLB are respectively changed to the internal supply voltage Vii and the ground voltage VSS (FIG. 16(g)).

The amplified voltage of the bit lines BL, BLB is transferred as an I/O signal through a column switch (not shown) which is controlled by the column decoder (not shown), and is outputted from the output buffer (not shown) to outside the DRAM 31. Since the amplifying speed of the sense amplifier AMP is heightened, time for reading data is shortened.

Thereafter, the word line WL0 is brought to the low level (VMI), the sense amplifier activating signals SA and SAB are respectively brought to the low level (VSS) and the high level (Vii), and the precharging signal PR is brought to the high level (VPP) (FIG. 16(h)). Then, the sense amplifier AMP is inactivated, and the read cycle is ended.

In the semiconductor integrated circuit constructed as described above, the pMOS 11 of the sense amplifier driving circuit 5 is controlled on by supplying the negative voltage to the gate of this pMOS 11. Therefore, the drain-to-source resistance of the pMOS 11 becomes low enough to increase the current density of the sense amplifier driving signal VP. It is accordingly possible to enhance the drivability of the sense amplifier AMP and heighten the amplifying speed thereof without altering the sense amplifier AMP and the sense amplifier driver 5. Consequently, the amplifying speed of the sense amplifier AMP can be heightened without enlarging a chip size.

In a case where the amplifying speed of the sense amplifier AMP need not be heightened, the sense amplifier driver 5 or the sense amplifier AMP itself can be reduced in size. Accordingly, the chip size can be reduced.

The resetting voltage VMI for the word line WL as generated by the negative voltage generator 37a is utilized as the negative voltage which is supplied to the gate of the pMOS 11. It is accordingly no longer needed to dispose a new negative voltage generator for generating the negative voltage which is supplied to the gate of the pMOS 11. As a result, the amplifying speed of the sense amplifier AMP can be heightened without enlarging the chip size of the semiconductor integrated circuit.

The negative voltage is supplied to the gate of the pMOS 11 of the sense amplifier driver 5. Therefore, the pMOS 11 can be reduced in size in the case where the amplifying speed of the sense amplifier AMP need not be heightened. In general, the mobility of carriers is lower in a pMOS than in an nMOS, and the gate width of the pMOS needs to be approximately double that of the nMOS on condition that the pMOS and the nMOS have the same drivability. Therefore, reduction in the size of the pMOS 11 is more effective to reduce the layout area of the sense amplifier driver 5, as compared with reduction in the size of the nMOS 14.

Further, without raising the supply voltage (internal supply voltage Vii) to be supplied to the source of the pMOS 11 of the sense amplifier driver 5, the same effect as in the case of raising this supply voltage is attained.

Figure 17:
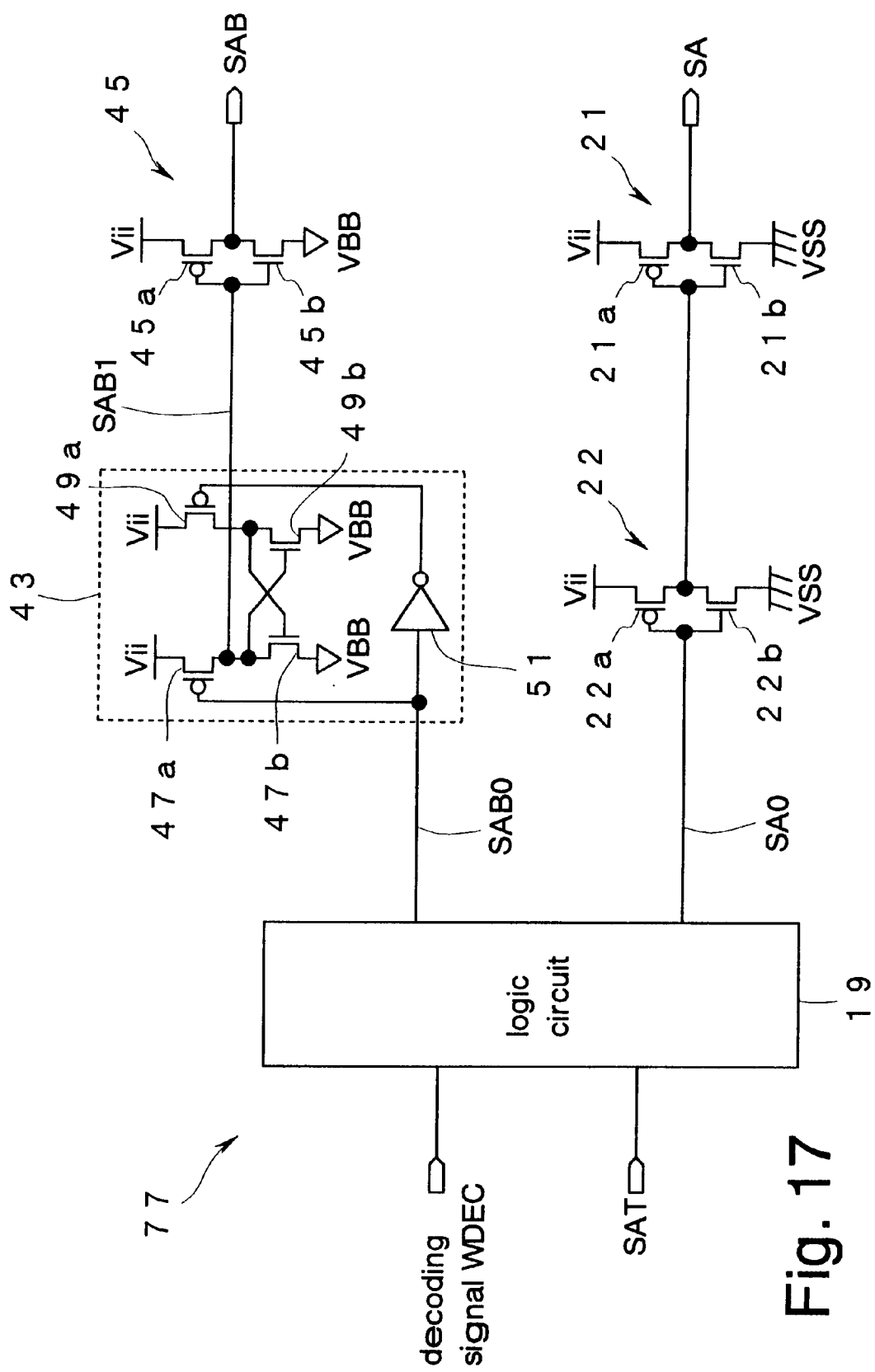
FIG. 17 is a circuit diagram showing the details of the SA generator of the second embodiment of the semiconductor integrated circuit according to the present invention.

FIG. 17 shows a SA generator 77 (corresponding to the controlling circuit) in the second embodiment of the semiconductor integrated circuit of the present invention. The circuit arrangement of this embodiment except the SA generator 77 is the same as that of the first embodiment of the semiconductor integrated circuit. In the figure, the components and functions same as those mentioned in the first embodiment will be indicated by identical reference numerals and the description thereof will be omitted here.

The SA generator 77 includes the same logic circuit 19, level shifter 43 and CMOS inverters 45, 21, 22 as in the SA generator 41. In this embodiment, a substrate voltage VBB is supplied to the sources of the nMOS's 47b, 49b of the level shifter 43 and the source of the nMOS 45b of the CMOS inverter 45. The substrate voltage VBB is set at −0.5 V by the substrate voltage generator 37b shown in FIG. 12. The substrate voltage generator 37b is the same circuit as the negative voltage generator 37a shown in FIG. 15.

Figure 18:
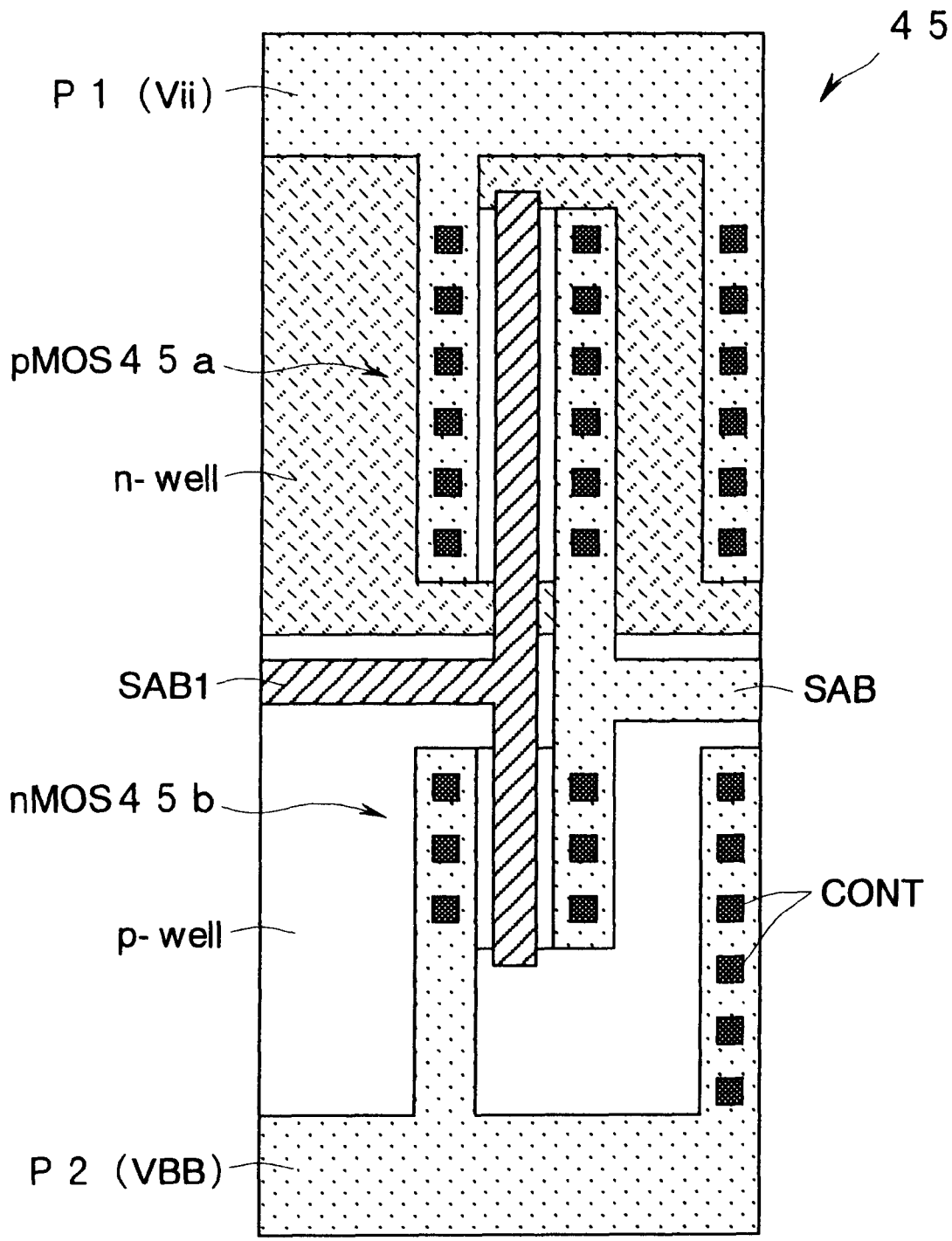
FIG. 18 is a layout showing the CMOS inverter of FIG. 17.

FIG. 18 shows the layout of the CMOS inverter 45 (cell) which is disposed in the SA generator 77.

An n-well is formed on the upper side of the figure, while a p-well is formed on the lower side of the figure. The pMOS 45a is formed in the n-well, and the nMOS 45b in the p-well. Power supply patterns P1 and P2 which are respectively connected to the source of the pMOS 45a and the nMOS 45b, are formed at the ends of the n-well and p-well. The power supply patterns P1 and P2 are respectively supplied with the internal supply voltage Vii and the substrate voltage VBB. In addition, the power supply pattern P2 is formed with a plurality of contact holes CONT for supplying the substrate voltage VBB to the p-well. That is, the supply of the substrate voltage VBB to the source of the nMOS 45b is done by utilizing the power supply pattern P2 for supplying the substrate voltage VBB, without arranging any special power supply pattern.

Also in the semiconductor integrated circuit of this embodiment, the same effects as in the foregoing first embodiment of the semiconductor integrated circuit can be attained.

Further, in this embodiment, the substrate voltage VBB is supplied to the source of the nMOS 45b of the CMOS inverter 45 disposed in the SA generator 77. It is therefore no longer needed to dispose a new negative voltage generator for applying the negative voltage to the gate of the pMOS 11 of the sense amplifier driver 5. As a result, the amplifying speed of the sense amplifier AMP can be heightened without enlarging the chip size of the DRAM 31.

Besides, the supply of the substrate voltage VBB to the source of the nMOS 45b is done by utilizing the power supply pattern P2 for supplying the substrate voltage VBB to the p-well. Therefore, it is no longer needed to dispose any new power supply pattern, and a layout area can be made small.

Figure 19:
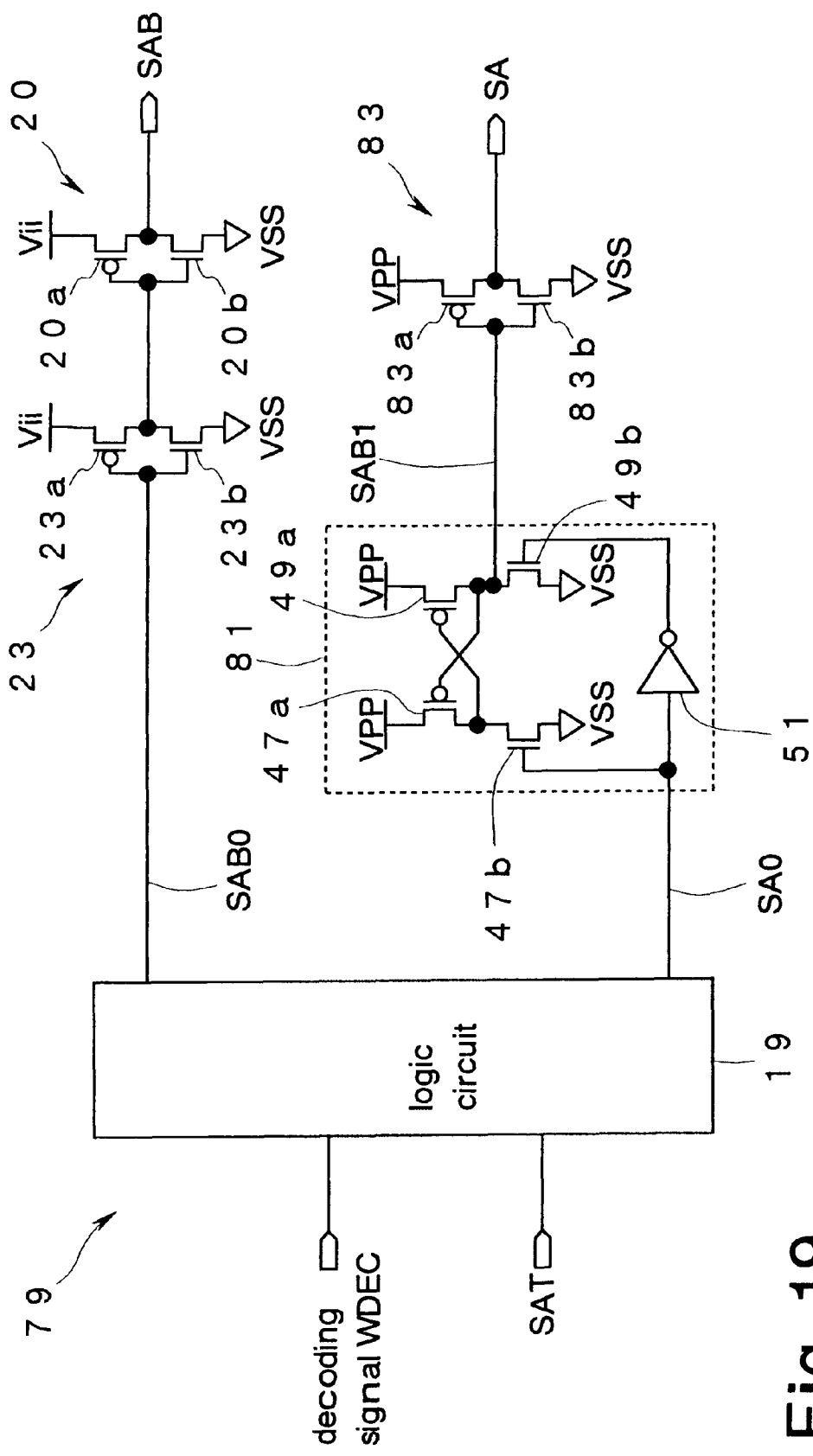
FIG. 19 is a circuit diagram showing the details of the SA generator of the third embodiment of the semiconductor integrated circuit according to the present invention.

FIG. 19 shows an SA generator 79 in the third embodiment of the semiconductor integrated circuit of the present invention. The circuit arrangement of this embodiment except the SA generator 79 is the same as that of the first embodiment of the semiconductor integrated circuit. In the figure, the components and functions same as those mentioned in the first embodiment will be indicated by identical reference numerals and the description thereof will be omitted here.

The SA generator 79 includes the same logic circuit 19 and CMOS inverters 20, 23 as in the SA generator 18 shown in FIG. 3, and a level shifter 81 and a CMOS inverter 83.

The level shifter 81 is configured of a pMOS 47a and an nMOS 47b connected in series, a pMOS 49a and an nMOS 49b connected in series, and an inverter 51. The sources of the pMOS's 47a, 49a are supplied with the boost voltage VPP of the word line WL. The sources of the nMOS's 47b, 49b are supplied with the ground voltage VSS. The activating signal SA0 is applied to the gate of the nMOS 47b, while a signal obtained by inverting the activating signal SA0 by means of the inverter 51 is applied to the gate of the nMOS 49b. The drain of the pMOS 49a is connected to the gate of the pMOS 47a, while the drain of the pMOS 47a is connected to the gate of the pMOS 49a. The activating signal SAB1 of the sense amplifier AMP is outputted from the drain of the pMOS 49a. Incidentally, the boost voltage VPP is set at 2.9 V by stepping up the supply voltage VCC (for example, 2.5 V) by means of a high voltage generator 39 which will be explained later.

The logic circuit 19 is fed with the decoding signal WDEC and the sense amplifier timing signal SAT, and outputs the activating signals SAB0, SA0. The CMOS inverter 20 receives the inverted signal of the activating signal SAB0 through the CMOS inverter 23, and outputs a further inverted signal as the sense amplifier activating signal SAB.

The level shifter 81 is a circuit which brings the high level of the activating signal SAB1 to the boost voltage VPP. Owing to the level shifter 81, during the high level of the activating signal SAB1, the gate-to-source voltage of the pMOS 83a is held at 0 V, so that an excessive steady-state current is prevented from flowing through the CMOS inverter 83.

The source of the pMOS 83a of the CMOS inverter 83 is supplied with the boost voltage VPP, while the source of the nMOS 83b is supplied with the ground voltage VSS. The CMOS inverter 83 receives the activating signal SAB1, and delivers the inverted sense amplifier activating signal SA.

Figure 20:
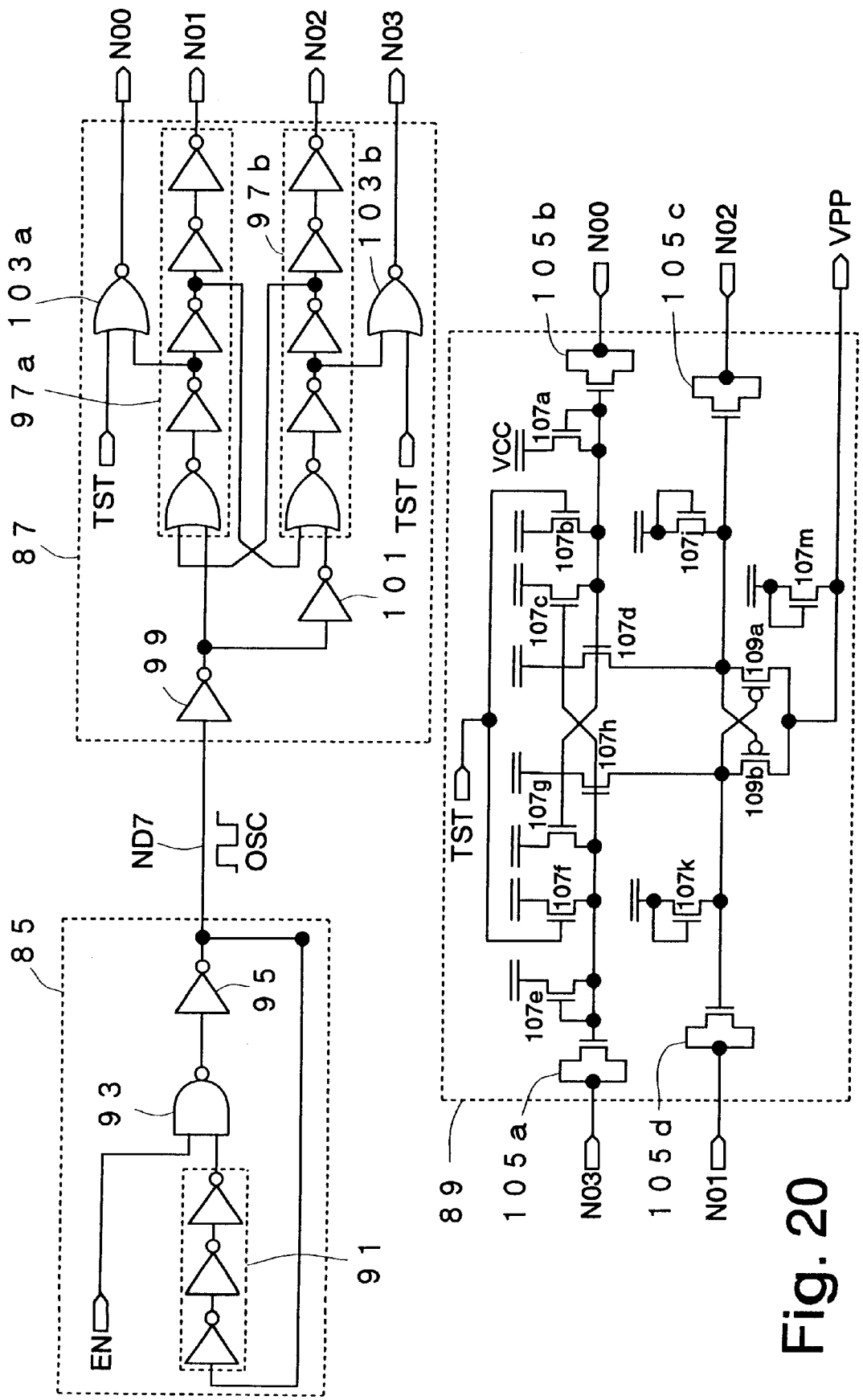
FIG. 20 is a circuit diagram showing the details of the high voltage generator in the third embodiment of the semiconductor integrated circuit.

FIG. 20 shows the high voltage generator 39 which generates the boost voltage VPP.

The high voltage generator 39 is constructed of an oscillator 85 for generating pulses OSC, an output circuit 87 for converting the pulses OSC into pulses of different phases, and a pumping circuit 89.

The oscillator 85 is configured of an inverter row 91 in which three inverters are connected in cascade, a NAND gate 93, and an inverter 95. The output node of the inverter row 91 is connected to one input node of the NAND gate 93. The other input node of the NAND gate 93 is fed with a controlling signal EN. The input node of the inverter 95 is connected to the output node of the NAND gate 93. The output node of the inverter 95 is connected to a node ND7. This node ND7 is connected to the input node of the inverter row 91 and that of the output circuit 87. The pulses OSC are outputted from the node ND7.

The output circuit 87 is configured of circuits 97a, 97b in each of which a 2-input NOR gate and four inverters are connected in cascade, two inverters 99, 101, and two 2-input NOR gates 103a, 103b. The node ND7 is connected to one input node of the circuit 97a through the inverter 99. The output node of the inverter at the third stage of the circuit 97b is connected to the other input node of the circuit 97a. The output node of the inverter 99 is connected to one input node of the circuit 97b through the inverter 101. The output node of the inverter at the third stage of the circuit 97a is connected to the other input node of the circuit 97b. The output node of the inverter at the second stage of the circuit 97a is connected to one input node of the NOR gate 103a. A testing signal TST is fed to the other input node of the NOR gate 103a. The output node of the inverter at the second stage of the circuit 97b is connected to one input node of the NOR gate 103b. The testing signal TST is fed to the other input node of the NOR gate 103b. The output node of the NOR gate 103a is connected to a node ND00, that of the circuit 97a is connected to a node ND01, that of the circuit 97b is connected to a node ND02, and that of the NOR gate 103b is connected to a node ND03.

The pumping circuit 89 is configured of four capacitors 105a, 105b, 105c, 105d made of nMOS's, eleven nMOS's 107a through 107m, and two pMOS's 109a, 109b. The sources and drains of the capacitors 105a, 105b, 105c, 105d are respectively connected to the nodes ND03, ND00, ND02, ND01. Connected to the gate of the capacitor 105b are the gate and source of the nMOS 107a, the sources of the nMOS's 107b, 107c, and the gates of the nMOS's 107d, 107g. Likewise, connected to the gate of the capacitor 105a are the gate and source of the nMOS 107e, the sources of the nMOS's 107f, 107g, and the gates of the nMOS's 107h, 107c. The testing signal TST is connected to the gates of the nMOS's 107b, 107f. Connected to the gate of the capacitor 105c are the sources of the nMOS's 107j, 107d, the source of the pMOS 109a, and the gate of the pMOS 109b. Likewise, connected to the gate of the capacitor 105b are the sources of the nMOS's 107k, 107h, the source of the pMOS 109b, and the gate of the pMOS 109a. The gates of the nMOS's 107j, 107k, 107m are connected to the supply voltage VCC. The source of the nMOS 107m is connected to the drains of the pMOS's 109a, 109b. The boost voltage VPP is outputted from the drains of the pMOS's 109a, 109b. The supply voltage VCC is supplied to the drains of the nMOS's 107a through 107m.

With the high voltage generator 39, when the controlling signal EN is at the high level, the oscillator 85 oscillates to generate the pulses OSC at the node ND7. The output circuit 87 receives the pulses OSC, and outputs the pulses of different phases to the nodes ND00, ND01, ND02, ND03, respectively.

The capacitors 105a, 105d and those 105b, 105c of the pumping circuit 89 are alternately charged and discharged in accordance with the inputted pulses. Besides, the supply voltage VCC is stepped up to the boost voltage VPP by rectification based on the nMOS's 107k, 107j and the on/off operations of the pMOS's 109a, 109b.

Incidentally, the testing signal TST is a signal which is held at the supply voltage VCC during an ordinary operation, and as which the boost voltage VPP is applied during a burn-in test. The voltage generating capability of the pumping circuit 89 is lightened by externally applying the boost voltage VPP as the testing signal TST.

Figure 21:
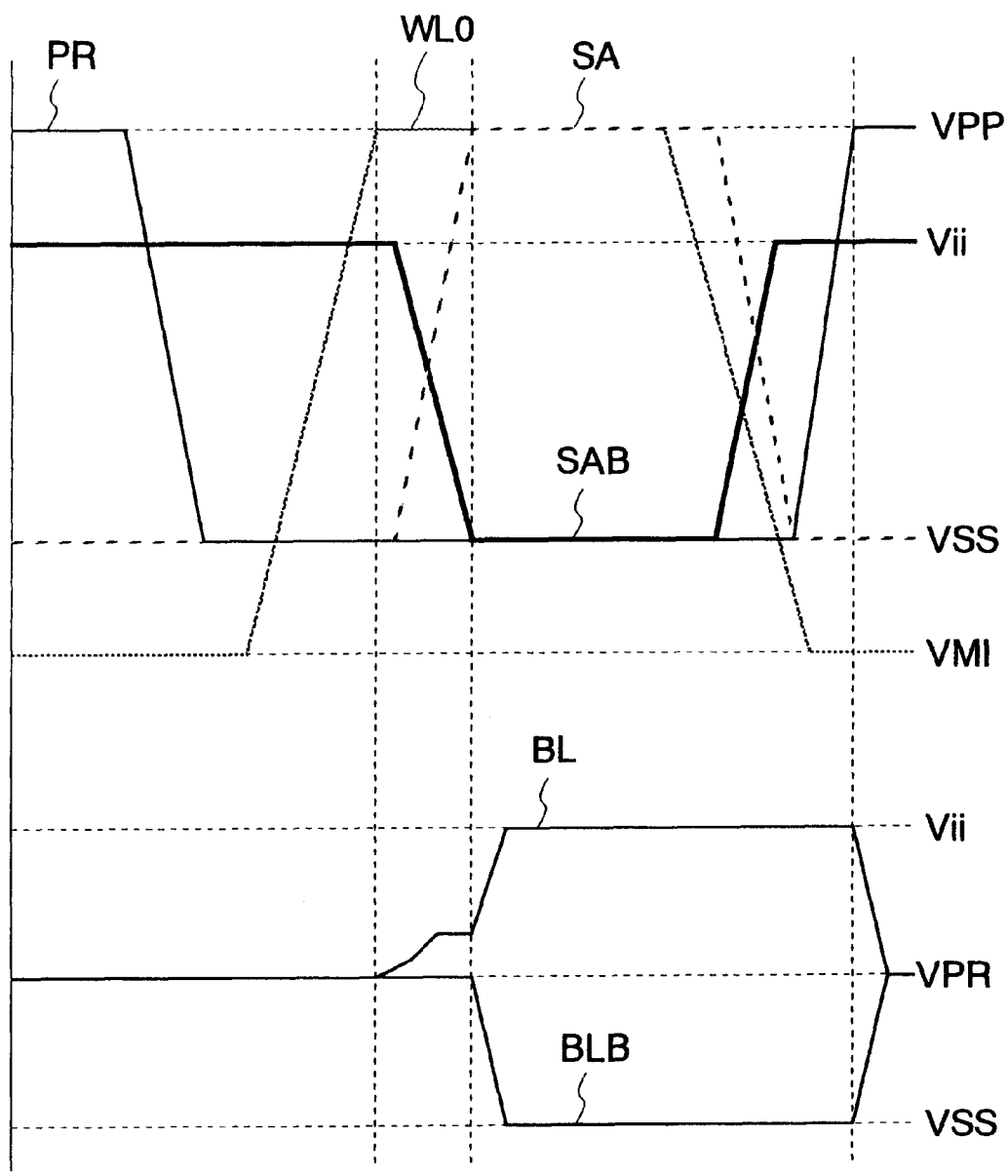
FIG. 21 is a timing chart showing the principal signals in the read cycle of the third embodiment.

With the semiconductor integrated circuit described above, as shown in FIG. 21, the high level of the sense amplifier activating signal SA rises to the boost voltage VPP in activating the sense amplifier AMP. Besides, the boost voltage VPP is applied to the gate of the nMOS 14 of the sense amplifier driver 5 shown in FIG. 13, and the ground voltage VSS is supplied as the sense amplifier driving signal VN. Therefore, the drain-to-source resistance of the nMOS 14 becomes sufficiently lower than in case of applying the internal supply voltage Vii to the gate of the nMOS 14, and the current density of the sense amplifier driving signal VN increases. Accordingly, the amplifying speed of the sense amplifier AMP is heightened. Here, the supply of the ground voltage VSS as the sense amplifier driving signal VN is done by the moving of electrons which are majority carriers in the nMOS 14.

Also in the semiconductor integrated circuit of this embodiment, the same effects as in the foregoing first and second embodiments of the semiconductor integrated circuit can be attained.

Further, in this embodiment, the boost voltage VPP which is used as the high level voltage for the word line WL is supplied to the source of the pMOS 83a of the CMOS inverter 83 disposed in the SA generator 79. It is therefore no longer needed to dispose a new negative voltage generator for the purpose of supplying the high voltage to the gate of the nMOS 14 of the sense amplifier driver 5. As a result, the amplifying speed of the sense amplifier AMP can be heightened without enlarging the chip size of the DRAM 31.

Next, an embodiment of a semiconductor memory device according to the present invention will be described with reference to the drawings.

In the ensuing description, the supply voltage (Viid) of a sense amplifier will be sometimes explained as a supply voltage for cells. As apparent from the memory circuit shown in FIG. 5, the sense amplifier SA drives the bit lines BL, /BL by its supply voltage Viid and amplifies the voltage of one bit line to the level of the supply voltage Viid. Further, the amplified bit line voltage Viid is stored in the capacitor included in the memory cell MC. Accordingly, the supply voltage Viid of the sense amplifier SA serves as the supply voltage for the cells in a rewrite mode. Besides, in the ensuing description of circuits, p-channel MOS transistors will be designated by reference numerals beginning with letter P, and n-channel MOS transistors by reference numerals beginning with letter N. The activating levels of controlling signals are a high level in some cases and a low level in the other cases, and the high or low level will be indicated as may be needed.

Figure 5:
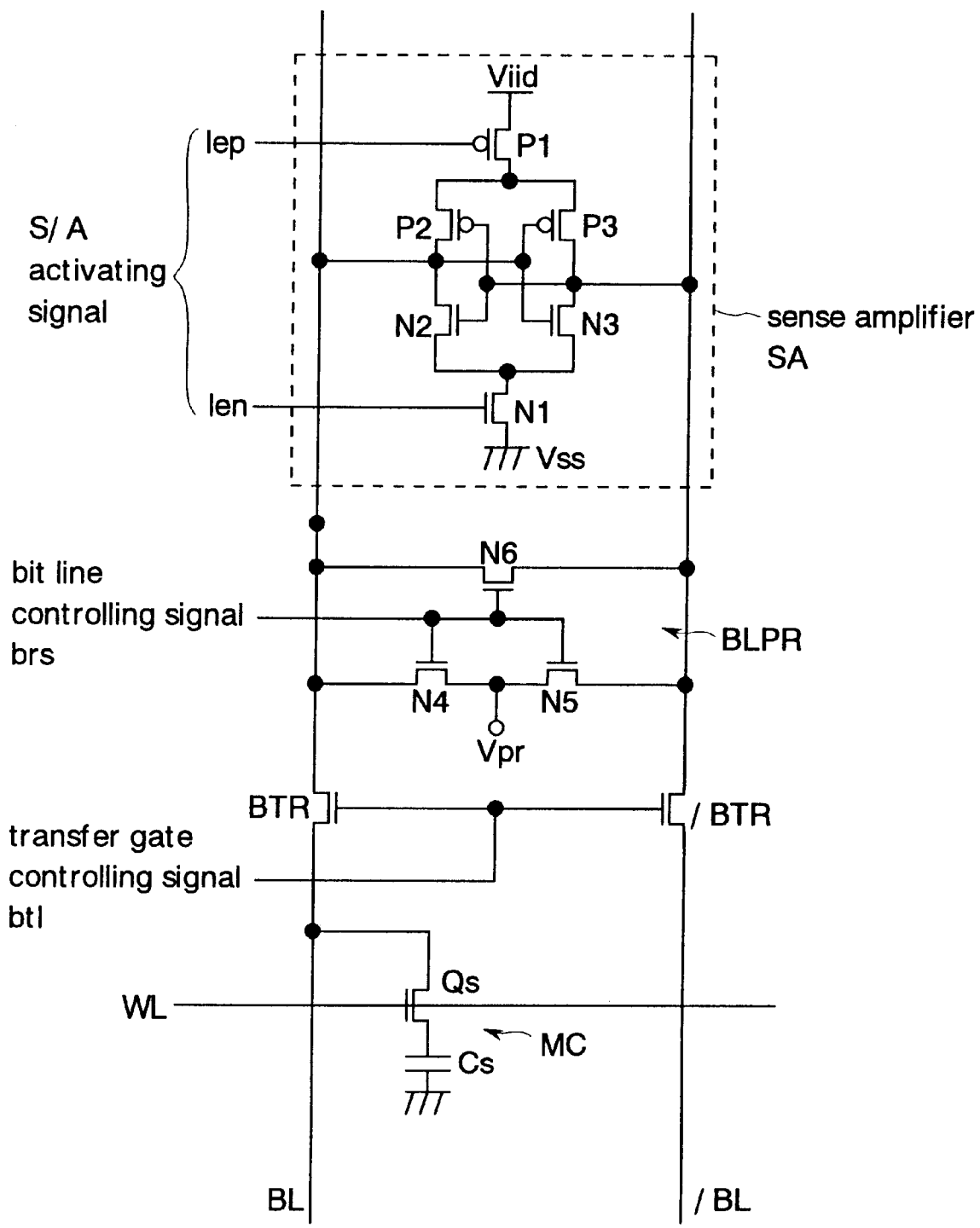
FIG. 5 is a circuit diagram showing an example of the general configuration of DRAMs.
Figure 6:
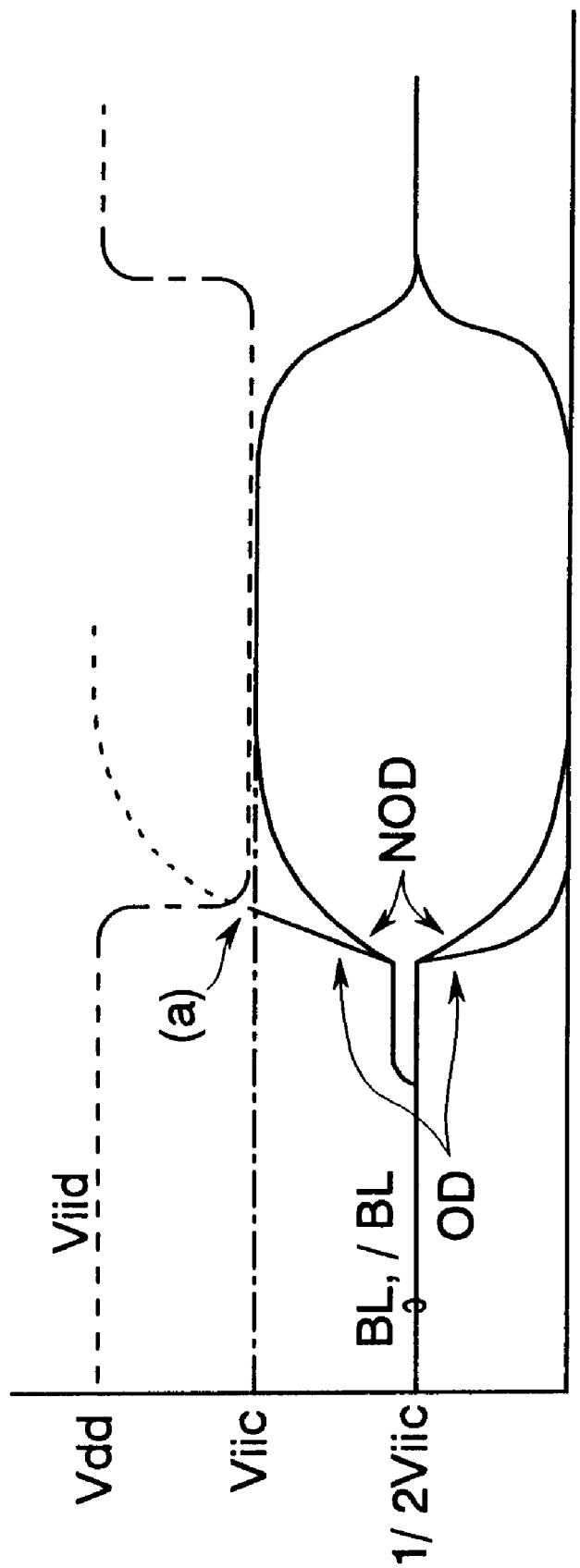
FIG. 6 is a timing chart showing the principle of the overdriving sense amplifier system.
Figure 7:
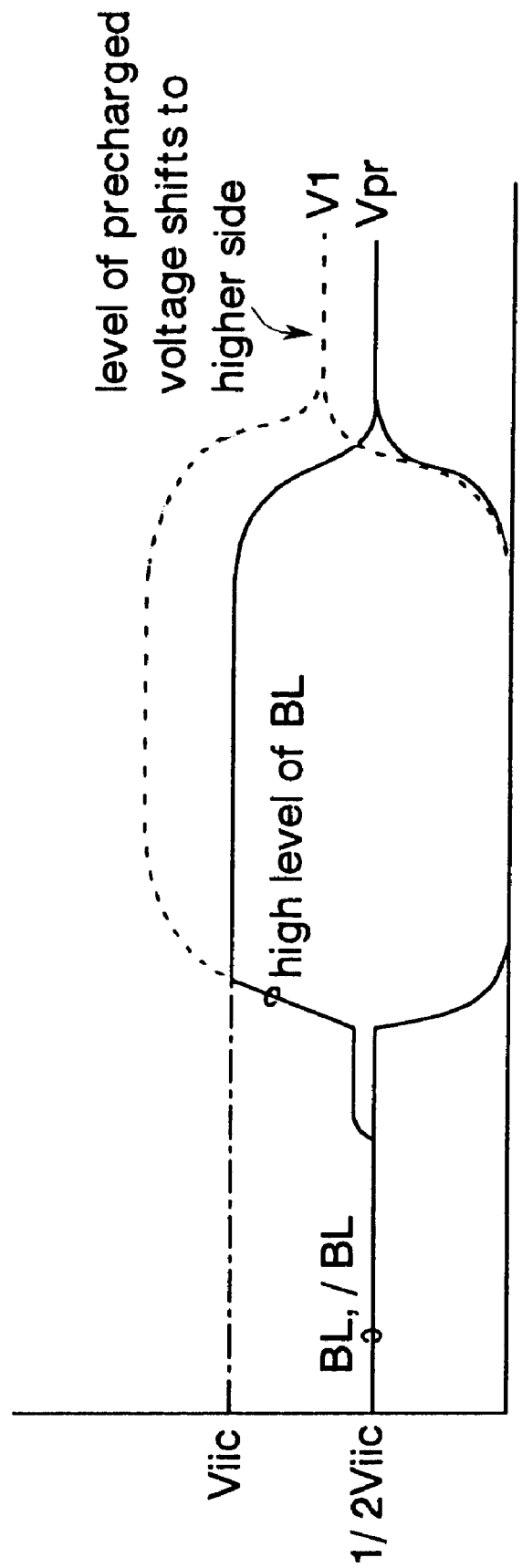
FIG. 7 is a timing chart showing a problem involved in the prior art.
Figure 22:
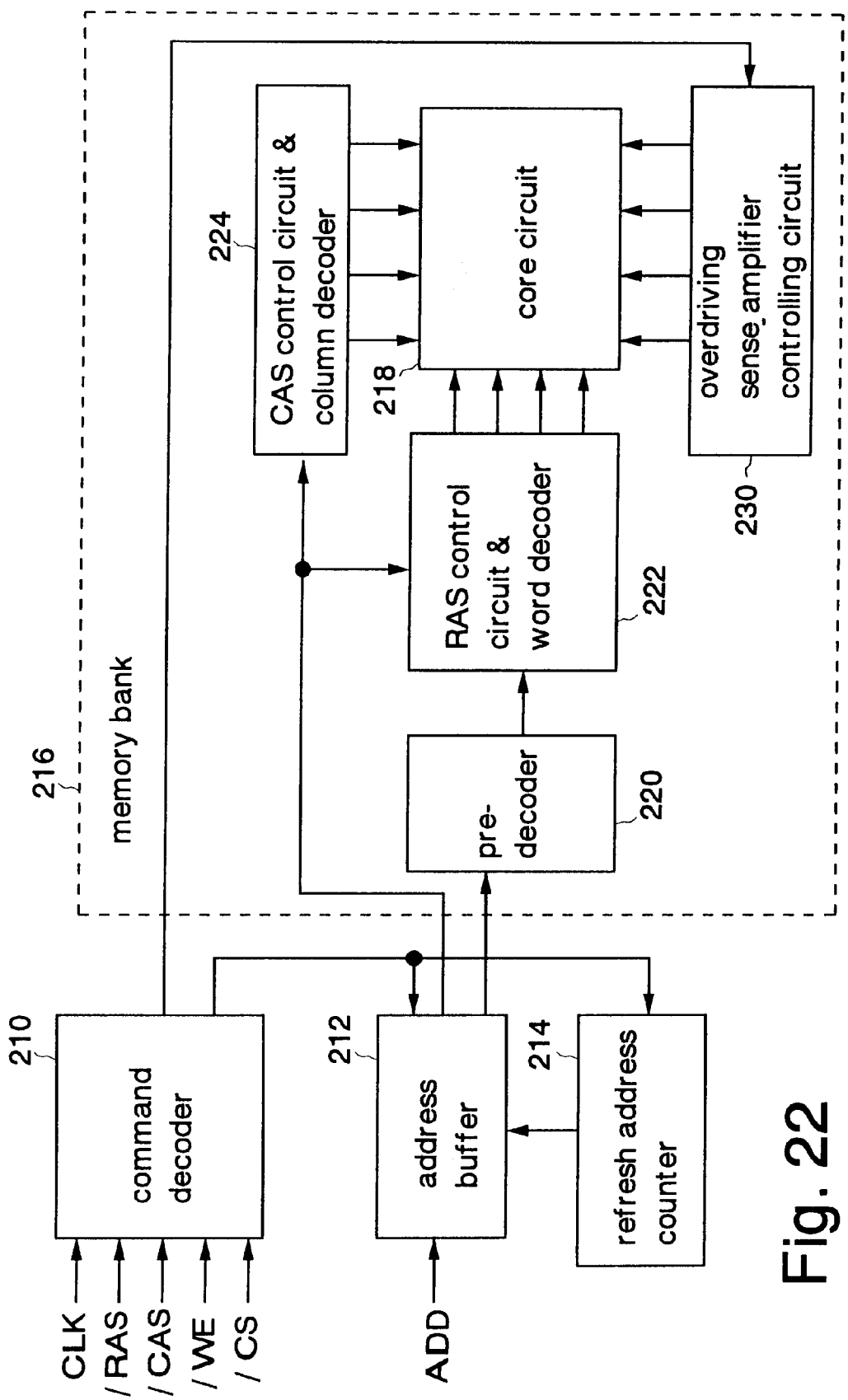
FIG. 22 is a schematic block diagram of the semiconductor memory device.

FIG. 22 is a schematic block diagram of the semiconductor memory device in this embodiment. The exemplified semiconductor memory device is a synchronous DRAM (SDRAM) which operates in synchronism with an external clock CLK. The semiconductor memory device in FIG. 22 comprises a command decoder 210, an address buffer 212 to which an address signal ADD is fed, a refresh address counter 214, or the like. The command decoder 210 receives a command organized by the combination of four controlling signals /RAS, /CAS, /WE, /CS, and decodes the command and generates various internal controlling signals. The refresh address counter 214 generates a refreshing address and feeds the generated signal to the address buffer 212 in a refresh operation. Further, the semiconductor memory device comprises a plurality of memory banks 216 in each of which a core circuit 218 is formed. Each memory bank 216 includes a predecoder 220, a RAS control circuit & word decoder 222, and a CAS control circuit & column decoder 224. Such circuits drive word lines, bit lines, memory cells, sense amplifiers, or the like, not shown, which are included in the core circuit 218. A memory circuit within the core circuit 218 is as shown in FIG. 5.

Each memory bank 216 includes therein an overdriving sense amplifier controlling circuit 230 (hereinbelow, also termed "ODSA circuit 230") which is disposed outside the core circuit 218. The ODSA circuit 230 controls the overdriving operation of the sense amplifier SA (refer to FIG. 5) which is disposed inside the core circuit 218. This ODSA circuit 230 is disposed in each memory bank 216 including the core circuit 218.

Figure 23:
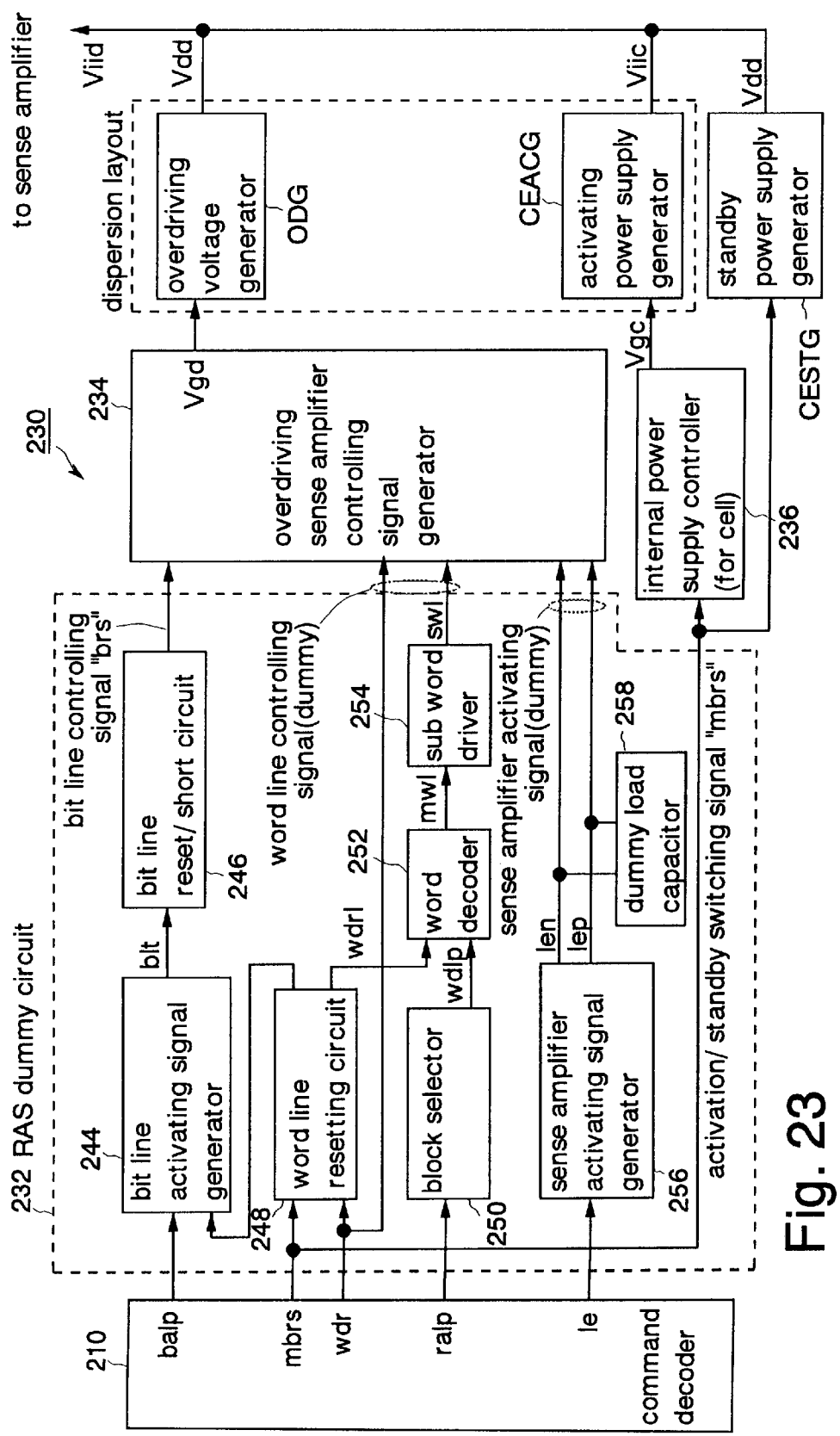
FIG. 23 is a block diagram showing the overdriving sense amplifier controlling circuit.
Figure 27:
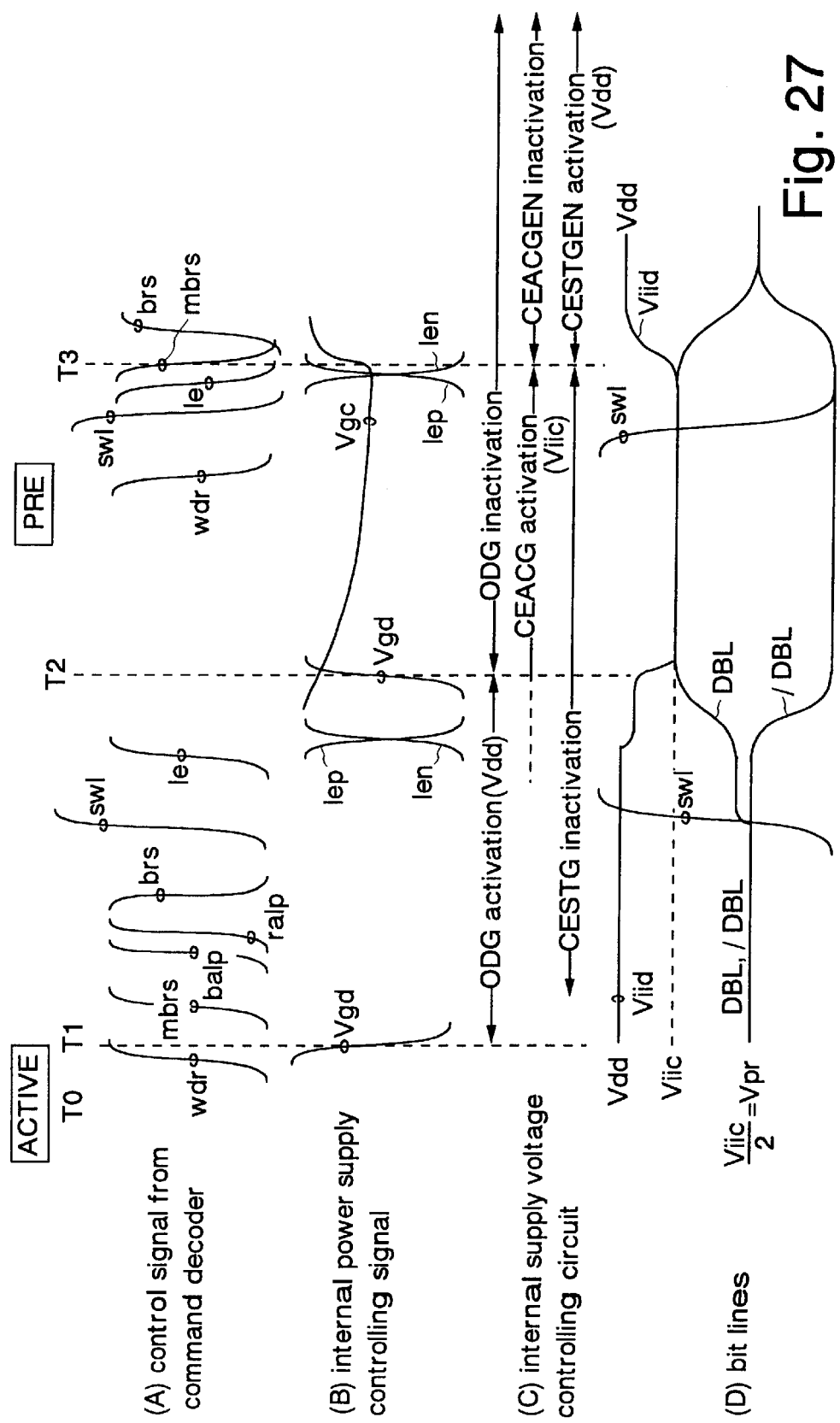
FIG. 27 is a timing chart showing the overdriving sense amplifier controlling circuit.

FIG. 23 shows a block diagram of the overdriving sense amplifier controlling circuit 230. FIG. 27 is a timing chart of the controlling circuit 230. When the memory bank 216 becomes an active state, then the ODSA circuit 230 within the particular memory bank operates. The controlling circuit 230 controls the overdriving operation of the sense amplifier included in the memory bank 216. The ODSA circuit 230 includes a RAS dummy circuit 232, an overdriving sense amplifier controlling signal generator 234 (hereinbelow, also termed "ODSGEN generator 234"), an overdriving voltage generator ODG (hereinbelow, also termed "ODG generator"), an internal power supply controller 236 for cells, an activating power supply generator CEACG (hereinbelow, also termed "CEACG generator") for the cells, and a standby power supply generator CESTG (hereinbelow, also termed "CESTG generator") for the cells. The ODSGEN generator 234 generates a controlling signal Vgd.

In response to the controlling signal Vgd, the ODG generator feeds a first supply voltage (Vdd) as a supply voltage (Viid) for overdriving the sense amplifier. The internal power supply controller 236 generates a controlling signal Vgc. In response to the controlling signal Vgc, the CEACG generator feeds a second supply voltage (Viic) being a lowered supply voltage for the cells, as the supply voltage (Viid) of the sense amplifier. The CESTG generator feeds the first supply voltage (Vdd) as the supply voltage (Viid) of the sense amplifier in response to an activation/standby switching signal mbrs in a standby mode.

The overdriving voltage generator ODG, cell activating power supply generator CEACG and cell standby power supply generator CESTG mentioned above correspond to the first, second and third power supply generators, respectively.

The basic arrangement and basic operations of the RAS dummy circuit 232 are the same as those of the RAS control circuit 222 for the core circuit 218. The layout data of the RAS dummy circuit 232 used are the same as those of the actual RAS control circuit 222. Conversely stated, the RAS control circuit 222 for the core circuit 218 has the same arrangement as that of the RAS dummy circuit 232 shown in FIG. 23. The RAS dummy circuit 232 receives a dummy bit line controlling signal brs, (dummy) word line controlling signals wdr, swl, and dummy sense amplifier activating signals len, lep on the basis of RAS command signals (balp, mbrs, wdr, ralp, le) outputted by the command decoder 210. The generated signals len, lep are fed to the ODSGEN generator 234. The relations of the timings of these controlling signals are indicated in FIG. 27 which will now be referred to.

As shown in FIG. 27, the command decoder 210 responds to an activation command ACTIVE, to activate (high level) the word line resetting signal wdr, to bring the activation/standby switching signal mbrs into an active state (high level) and to activate the block selecting signal balp. Thereafter, the command decoder 210 activates (high level) the word line drive timing signal ralp at a predetermined timing and further activates the sense amplifier drive timing signal le at a predetermined later timing.

A word line resetting circuit 248 generates controlling signals brsl and wdrl in response to the word line resetting signal wdr and the activation/standby switching signal mbrs. A bit line activating signal generator 244 generates a bit line activating signal (or transfer gate controlling signal) blt in response to the controlling signal brsl and the block selecting signal balp. A bit line reset/short circuit 246 responds to the bit line activating signal blt, to inactivate (low level) the bit line controlling signal brs and to inactivate the bit line precharging circuit BLPR shown in FIG. 5.

A block selector 250 activates a timing signal wdlp containing the logic of block selection, in response to the word line drive timing signal ralp. However, the dummy block selector 250 is not fed with a block selecting signal and is always kept in a block selecting state. Subsequently, a word decoder 252 drives a dummy main word line mwl in response to the timing signal wdlp. Further, a sub word driver 254 drives a dummy sub word line swl in response to the main word line mwl.

Further, a sense amplifier activating signal generator 256 activates the activating signals len, lep (high level and low level, respectively) in response to the sense amplifier drive timing signal le.

All the above circuits are dummy circuits. The basic arrangements of these circuits are the same as in the actual RAS control circuit 222, and the individual timing signals are controlled at about the same timings.

The RAS dummy circuit 232, however, differs from the actual RAS control circuit 222 in some points. More specifically, the RAS dummy circuit 232 has a dummy load capacitor 258 on a path which connects the sense amplifier activating signal generator 256 and the ODSGEN generator 234. In the actual RAS control circuit 222, the sense amplifier activating signals len, lep need to drive a large number of sense amplifier drivers. In contrast, in the RAS dummy circuit 232, the sense amplifier activating signals len, lep may drive only one sense amplifier driver. Accordingly, the dummy load capacitor 258 is connected in order that the operation timing of a monitoring sense amplifier driver (refer to FIG. 24) disposed in the ODSGEN generator 234 may be brought into agreement with the operation timing of the actual sense amplifier driver. Further, the RAS dummy circuit 232 differs from the actual RAS control circuit 222 in the point that, as explained above, the logic for selecting a block within the bank 216 is not accepted. Thus, the ODSA circuit 230 operates whenever the corresponding bank 216 is in its active state.

As seen from the overall timing chart shown in FIG. 27, the activation command ACTIVE is inputted, and the word line resetting signal wdr is activated (high level). In response to the activation, the ODSGEN generator 234 activates (low level) the controlling signal Vgd. Then, an activation period is started at a time T1. The ODG generator is activated by the activation of the controlling signal Vgd, thereby to supply the external supply voltage (Vdd) being the first supply voltage as the sense amplifier supply voltage (Viid). Besides, in response to the activation (high level) of the activation/standby switching signal mbrs, the CESTG generator being the third supply voltage generating circuit is inactivated to stop supplying the voltage Vdd. Also, in response to the activation of the activation/standby switching signal mbrs, the internal power supply controller 236 is activated to allow supplying the second supply voltage (Viic) as the sense amplifier supply voltage (Viid).

In the activation period, a voltage difference is generated between bit lines by the drive of a sub word line swl. The monitoring sense amplifier MSA is correspondingly activated to amplify the voltage on a dummy bit line DBL on a high level side. Subsequently, the timing at which the voltage on the dummy bit line DBL agrees with the internal supply voltage Viic is detected by the ODSGEN generator 234. Upon the detection, the controlling signal Vgd is inactivated (high level). The ODG generator is inactivated by the inactivation of the controlling signal Vgd, to stop supplying the external supply voltage (Vdd) as the sense amplifier supply voltage (Viid). Upon the stop, the internal power supply controller 236 activates (low level) the controlling signal Vgc. The CEACG generator supplies the lowered internal supply voltage Viic as the sense amplifier supply voltage (Viid).

The activation/standby switching signal mbrs becomes its standby state (low level) in response to a precharge command PRE. The internal power supply controller 236 is responsively inactivated. Then, the CEACG generator stops supplying the internal supply voltage Viic. Further, the CESTG generator is activated to supply the first supply voltage (Vdd) as the sense amplifier supply voltage (Viid). Besides, it prevents the sense amplifier supply voltage (Viid) from lowering down to the ground voltage. During a standby period, the sense amplifier is not driven, and hence, the sense amplifier supply voltage (Viid) is unnecessary. However, in a case where the voltage Viid has lowered down to the ground voltage in the standby period, it needs to be raised again in the succeeding activation period. Therefore, the voltage Viid is kept at the level of the first supply voltage Vdd of high level as stated above.

The highest one of the voltages Vdd, Viic and Vdd which are respectively delivered from the ODG generator, CEACG generator and CESTG generator, is supplied to the sense amplifier as the sense amplifier supply voltage Viid.

Figure 24:
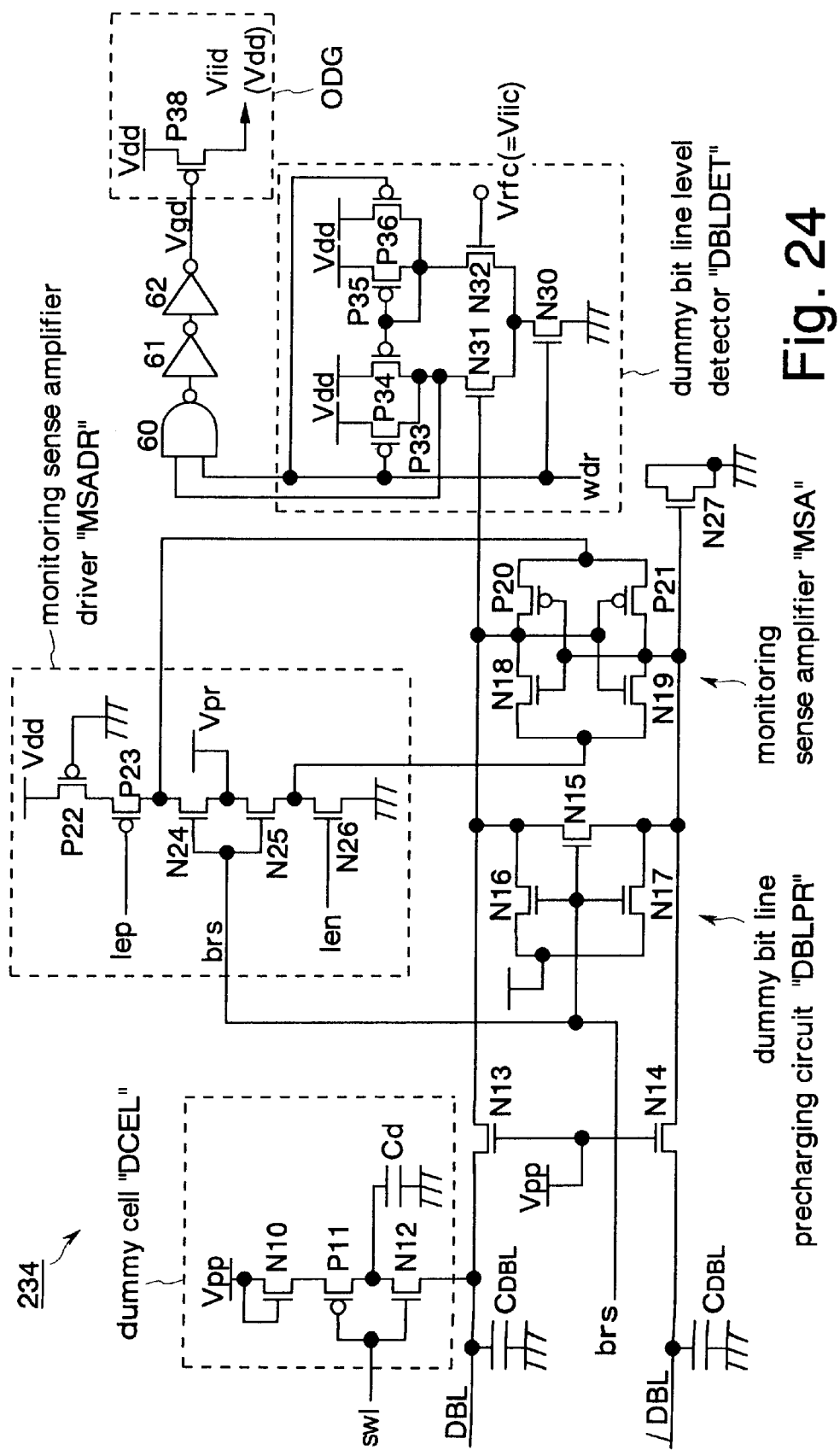
FIG. 24 is a circuit diagram showing the overdriving sense amplifier controlling signal generator.

FIG. 24 is a circuit diagram of an overdriving sense amplifier controlling signal generator 234. This ODSGEN generator 234 includes a dummy sub word line swl, dummy bit lines DBL, /DBL, a dummy cell DCEL connected to the lines, a dummy bit line precharging circuit DBLPR, a monitoring sense amplifier MSA, a monitoring sense amplifier driver MSADR, and a dummy bit line level detector DBLDET (hereinbelow, also termed "detector DBLDET"). The dummy bit line precharging circuit DBLPR is connected to the dummy bit lines through transfer gate MOSFET's N13, N14. The monitoring sense amplifier driver MSADR drives the monitoring sense amplifier MSA. The controlling signal Vgd which is the output of the detector DBLDET, is fed to the gate of a pMOS transistor P38 included in the ODG generator.

The dummy cell DCEL is configured of transistors N10, P11, N12 and a capacitor Cd. When the sub word line swl is at a low level, the dummy cell DCEL stores a high level in the capacitor Cd. When the sub word line swl is activated to become the high level, stored charges are read out onto the dummy bit line DBL through the transistor N12.

The monitoring sense amplifier MSA has the same circuit arrangement as that of the actual sense amplifier SA shown in FIG. 5, and is configured of transistors N18, N19, P20, P21. The transistor size of the monitoring sense amplifier MSA is set at N times that of the actual sense amplifier SA (where letter N denotes a positive integer being, for example, 256) in order to conform to the driving load of the actual sense amplifier SA. The actual sense amplifiers in the number N are simultaneously driven by a common sense amplifier driver. Accordingly, the load capacitance of the monitoring sense amplifier MSA is equalized to a load capacitance in the case of driving the N sense amplifiers SA, owing to the above contrivance that the transistor size of the monitoring sense amplifier MSA is N times as large as the transistor size of each individual sense amplifier SA.

The monitoring sense amplifier driver MSADR is configured of transistors P22, P23, N24, N25, N26. Upon receiving the high level of the bit line controlling signal brs, the monitoring sense amplifier driver MSADR supplies the precharged voltage Vpr to the monitoring sense amplifier MSA through the transistors N24, N25. In addition, the monitoring sense amplifier driver MSADR responds to the sense amplifier activating signals lep, len, to turn on the transistors P23, N26 and to supply the external supply voltage Vdd to the monitoring sense amplifier MSA.

The monitoring sense amplifier driver MSADR has a transistor size which conforms to the monitoring sense amplifier MSA. Besides, the transistor P22 is formed with the same transistor size as that of the transistor which supplies the supply voltage Vdd in the actual sense amplifier driver, and has the same current feeding capability as that of the transistor in the actual driver. In the monitoring sense amplifier driver MSADR, the transistor P22 is always held in its conductive state by grounding its gate. Thus, when the monitoring sense amplifier MSA is activated, the transistor P22 continues to supply the supply voltage Vdd for the sense amplifier MSA.

As the transistor size of the monitoring sense amplifier MSA is set to be N times that of the actual sense amplifier SA, the capacitance CDBL of each of the dummy bit lines DBL, /DBL is also set to be N times that of each of the actual bit lines BL, /BL. Besides, the operation timing of the dummy bit lines DBL, /DBL is brought into agreement with that of the actual bit lines BL, /BL. Further, the dummy bit line precharging circuit DBLPR is configured of transistors N15, N16, N17, and has the same circuit arrangement as that of the actual precharging circuit BLPR. However, the transistor size of the circuit DBLPR is set to be N times. Likewise to the actual precharging circuit BLPR, the dummy bit line precharging circuit DBLPR responds to the high level of the bit line controlling signal brs, to turn on the transistors N15, N16, N17 and to precharge the pair of dummy bit lines DBL, /DBL to the precharging level Vpr (=Viic/2). The bit line transfer gates N13, N14 are always held in their conductive states by the boost voltage (Vpp) supplied thereto. A capacitor N27 is connected in order to give the dummy bit line /DBL a capacitance which is equal to the gate capacitance of a transistor N31 constituting the detector DBLDET.

The detector DBLDET makes the comparison between the voltage on the dummy bit line DBL of high level and the voltage Viic (=Vrfc) of the internal power supply. Thus, it detects the timing at which the voltage on the dummy bit line DBL amplified by the monitoring sense amplifier MSA reaches the voltage of the internal supply voltage Viic. In attendance on the detection, the controlling signal Vgd is inactivated (high level), and the ODG generator is inactivated. In attendance on the inactivation, the transistor P38 turns off and stops supplying the external supply voltage (Vdd) as the sense amplifier supply voltage (Viid).

The detector DBLDET is configured of transistors P33 through P36 and N30 through N32, and is a differential circuit whose load circuit is a current mirror circuit. As indicated in the timing chart of FIG. 27, during the inactivation period (low level) of the word line resetting signal wdr, the transistors P33, P36 are both turned on to hold their drains at the high level. Then, the output of a NAND gate 60 becomes the high level, and the controlling signal Vgd becomes the high level. Therefore, the transistor P38 of the ODG generator lies in its turned off state. Thereafter, the word line resetting signal wdr is activated (high level). Then, the output of the NAND gate 60 becomes the low level, and the controlling signal Vgd becomes the low level. Accordingly, the transistor P38 of the ODG generator is turned on, and the external supply voltage (Vdd) is supplied as the sense amplifier supply voltage (Viid). At the same time, the transistor N30 is turned on, and the detector DBLDET is activated to detect the level of the dummy bit line DBL.

As shown in FIG. 27, after the word line resetting signal wdr has changed, the command decoder 210 outputs the controlling signals mbrs, balp, ralp, le to the RAS dummy circuit 232. In response to these controlling signals, the RAS dummy circuit 232 operates at about the same timing as that of the actual RAS control circuit. Owing to the operation, the dummy bit line precharging circuit DBLPR is inactivated. The signal of the dummy sub word line swl is caused to rise. Then, the monitoring sense amplifier driver MSADR drives the monitoring sense amplifier MSA. The series of operations are performed at the same operation timings as those of the memory circuit included in the actual memory core.

The voltage on the dummy bit line DBL on the high level side is amplified by the monitoring sense amplifier MSA which is driven by the external supply voltage (Vdd). This voltage rises from the precharging level vpr toward the external supply voltage (Vdd). In due course, the voltage on the dummy bit line DBL reaches the level of the internal supply voltage Viic for the cells. The detector DBLDET detects the reach in level, and inactivates (high level) the controlling signal Vgd. The ODG generator is inactivated to turn off the transistor P38. As a result, the supply of the external supply voltage (Vdd) for the supply voltage (Viid) of the actual sense amplifier within the core circuit is stopped.

Figure 25:
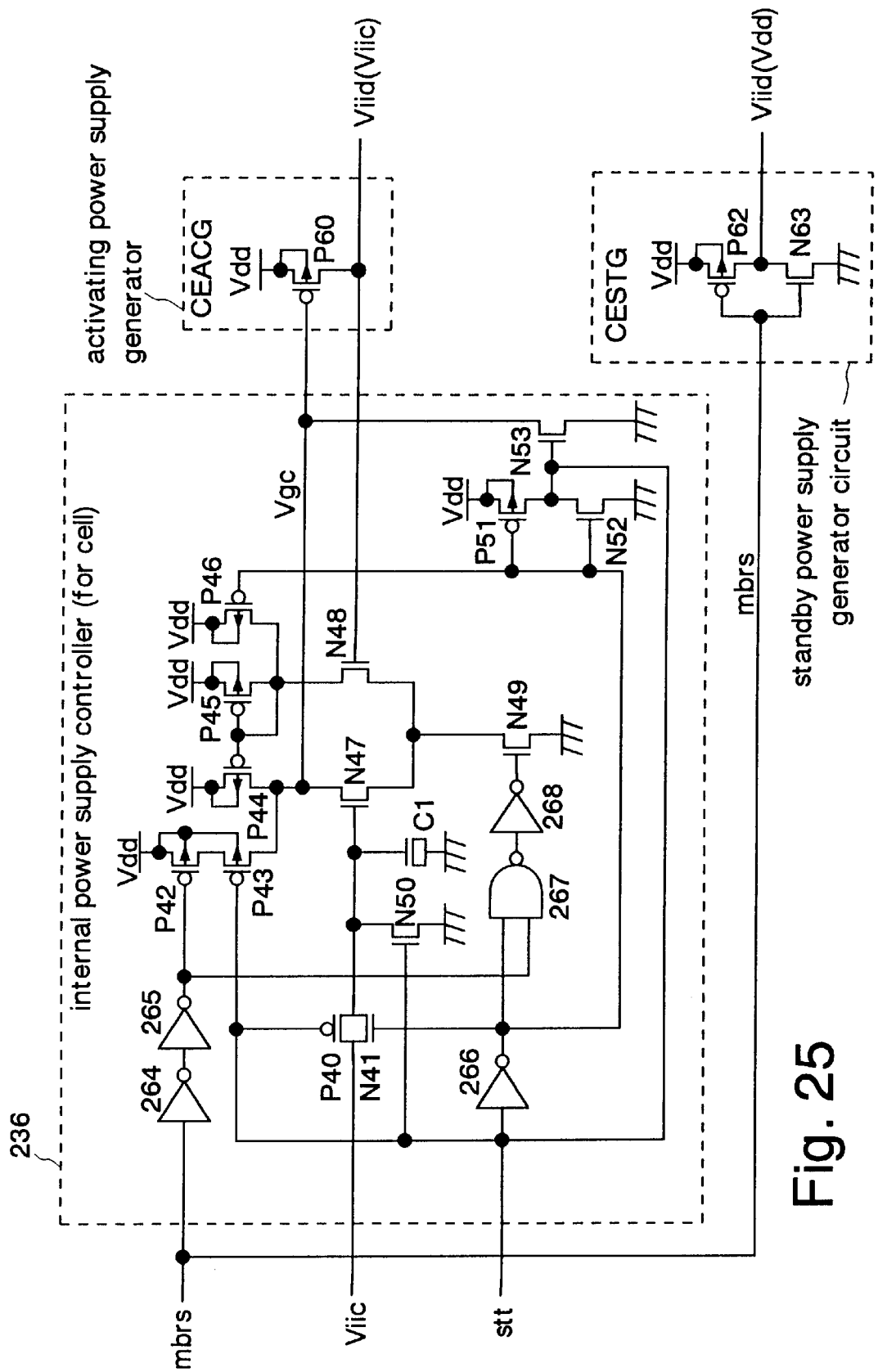
FIG. 25 is a circuit diagram showing the internal power supply controller.

FIG. 25 shows the internal power supply controller 236, the CEACG generator and the CESTG generator. As the supply voltage (Viid) of the actual sense amplifier, the voltages Viic and Vdd are also supplied from the CEACG generator and the CESTG generator. These voltages Viic and Vdd are switched in accordance with the activation/standby switching signal mbrs delivered from the command decoder 210. The signal mbrs becomes the high level when the corresponding bank is in its active state. The internal power supply controller 236 becomes its inactive state, and allows the cell supply voltage controlling signal Vgc to be activated. In consequence, the CEACG generator supplies the internal supply voltage (Viic) as the sense amplifier supply voltage (Viid) after the end of the overdriving of the sense amplifier, as will be explained later. The signal mbrs becomes the low level when the corresponding bank is in its standby state. The CESTG generator is activated to turn on a transistor P62. Then, the external supply voltage (Vdd) is supplied as the sense amplifier supply voltage (Viid).

As stated before, the highest one of the voltages delivered from the ODG generator, CEACG generator, and CESTG generator becomes the sense amplifier supply voltage Viid for driving the sense amplifier.

The internal power supply controller 236 is fed with a start signal stt which becomes an H (high) pulse at the start of the memory, and the activation/standby switching signal mbrs. Also, the internal supply voltage Viic is supplied as a reference voltage. The internal power supply controller 236 is a differential circuit configured of transistors P42 through P46 and N47 through N49. The differential circuit is activated in response to the activation (high level) of the signal mbrs. Then, the sense amplifier supply voltage Viid lowers relatively to the external supply voltage Vdd. Upon the detection that the voltage Viid has become lower than the reference voltage Viic, the controlling signal Vgc is brought to the low level. The CEACG generator turns on a constituent transistor P60, and supplies the internal supply voltage (Viic) as the sense amplifier supply voltage (Viid).

After the semiconductor memory device has been started up, the start signal is maintained at the high level until the external supply voltage is stablized. In response to this, a transistor N53 constituting the controller 236 is turned off, the transistor P43 is turned off, and the controlling signal Vgc becomes the low level. As a result, the CEACG generator turns on the transistor P60, thereby to raise the sense amplifier supply voltage Viid up to the internal supply voltage Viic. Besides, a transistor N50 constituting the controller 236 is turned on to discharge a capacitor C1 on the reference voltage side. Thereafter, the controlling signal mbrs hold their low levels. Therefore, the transistors P42, P43 are turned on, the controlling signal Vgc becomes the high level, and the CEACG generator is inactivated. Besides, the capacitor C1 is supplied with the reference voltage Viic.

During the standby period, the controlling signal mbrs is at the low level. Therefore, the CESTG generator is activated to turn on the transistor P62, so that the external supply voltage (Vdd) is supplied as the sense amplifier supply voltage (Viid). Thereafter, during the activation period, the activation/standby switching control signal mbrs becomes the high level, and the CESTG generator is inactivated to turn off the transistor P62. Herein, the transistor N63 of the CESTG generator having a high resistance is turned on, and only a leakage current is caused to flow.

The output of an inverter 265 included in the controller 236 becomes its high level in response to the high level of the activation/standby switching control signal mbrs, where the transistor P42 is turned off. At the same time, the output of an inverter 268 included in the controller 236 becomes its high level, and the transistor N49 is turned on. As a result, the internal power supply controller 236 is activated. Then, the voltage Viid of the sense amplifier supply voltage and the voltage Viic of the internal supply voltage are compared by the transistors N47, N48. In the starting first period of the activation period, the ODG generator supplies the external supply voltage (Vdd) being the first supply voltage as the sense amplifier supply voltage (Viid), as explained before. Accordingly, the differential circuit included in the internal power supply controller 236 turns on the transistor N48 and turns off the transistor N47. The controlling signal Vgc is held at the high level. The CEACG generator holds the turned off state of the transistor P60.

As shown in FIG. 27, the signal of the dummy sub word line swl rises, the monitoring sense amplifier MSA is driven, and the voltage on the dummy bit line DBL rises up to the internal supply voltage Viic. Besides, the transistor P38 of the ODG generator is turned off. As a result, the sense amplifier supply voltage Viid lowers. At a time T2 indicated in FIG. 27, the internal power supply controller 236 detects the voltage lowering and brings the controlling signal Vgc to the low level. The CEACG generator turns on the transistor P60 and supplies the internal supply voltage (Viic) as the sense amplifier supply voltage (Viid). At this timing, the overdriving operation of the actual sense amplifier ends.

During the activation period, the voltage Viid of the sense amplifier supply voltage is prevented from rising unnecessarily by the high-impedance transistor N63 of the CESTG generator.

As shown in FIG. 27, the precharge command PRE is fed to shift the activation period to the standby period at a time T3. In the standby period, it is effective for the curtailment of power consumption to prevent the sense amplifier supply voltage (Viid) from lowering down to the ground level. In the prior art, the cell supply voltage (Viic) is supplied as the sense amplifier supply voltage (Viid) during the standby period. With such an operation, the internal power supply controller 236 needs to be kept activated during the standby period. The activated state increases the power consumption conversely.

In this embodiment, when the operation has been shifted to the standby period, the internal power supply controller 236 is inactivated by the low level of the activation/standby switching control signal mbrs. Consequently, the power consumption of the internal power supply controller 236 is not involved. Instead, the CESTG generator is activated by the low level of the controlling signal mbrs, thereby to supply the external supply voltage (Vdd) as the sense amplifier supply voltage (Viid). No special controller is required for the activation of the CESTG generator. Accordingly, the power consumption can be made lower than in the case of activating the internal power supply controller 236.

FIGS. 26(A) through 26(C) are diagrams for explaining examples of internal power supply circuits. FIG. 26(A) shows a boost or step-up circuit which generates the internal boost voltage (Vpp) from the external supply voltage (Vdd). Upon receiving a pulse øa, a transistor N70 is turned on to charge a capacitor C2. Thereafter, a pulse øb is fed, and a transistor N71 is simultaneously turned on by receiving a pulse øc. The level of the boost supply voltage Vpp is made higher than the external supply voltage Vdd. The voltage Vpp is boosted by repeating the above operation, until it becomes higher than the external supply voltage Vdd. This voltage Vpp is utilized as the word line driving voltage.

FIG. 26(B) is a graph showing the relations of the supply voltages Vdd, Vpp, Viic. The axis of abscissas represents the external supply voltage (Vdd). With the fluctuation of the external supply voltage (Vdd), the respective voltages Vpp, Viic change. In this exemplified case, the boost voltage Vpp and the lower voltage Viic are held at constant levels in a region where the external supply voltage Vdd exceeds about 2.5 V.

Figure 28:
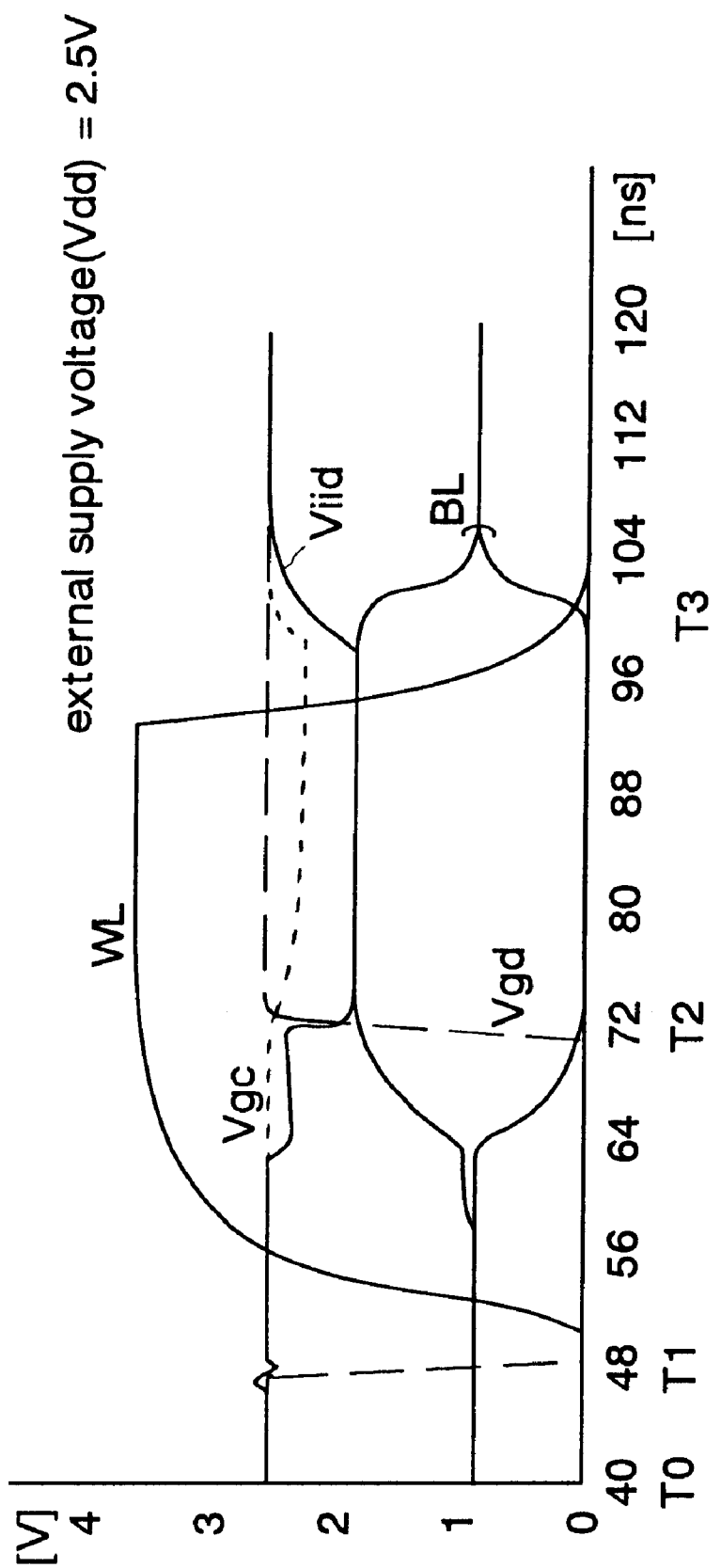
FIG. 28 is a timing chart showing the change of the sense amplifier supply voltage Viid during the memory operation in the case where the external supply voltage Vdd is set at the standard voltage (2.5V)
Figure 29:
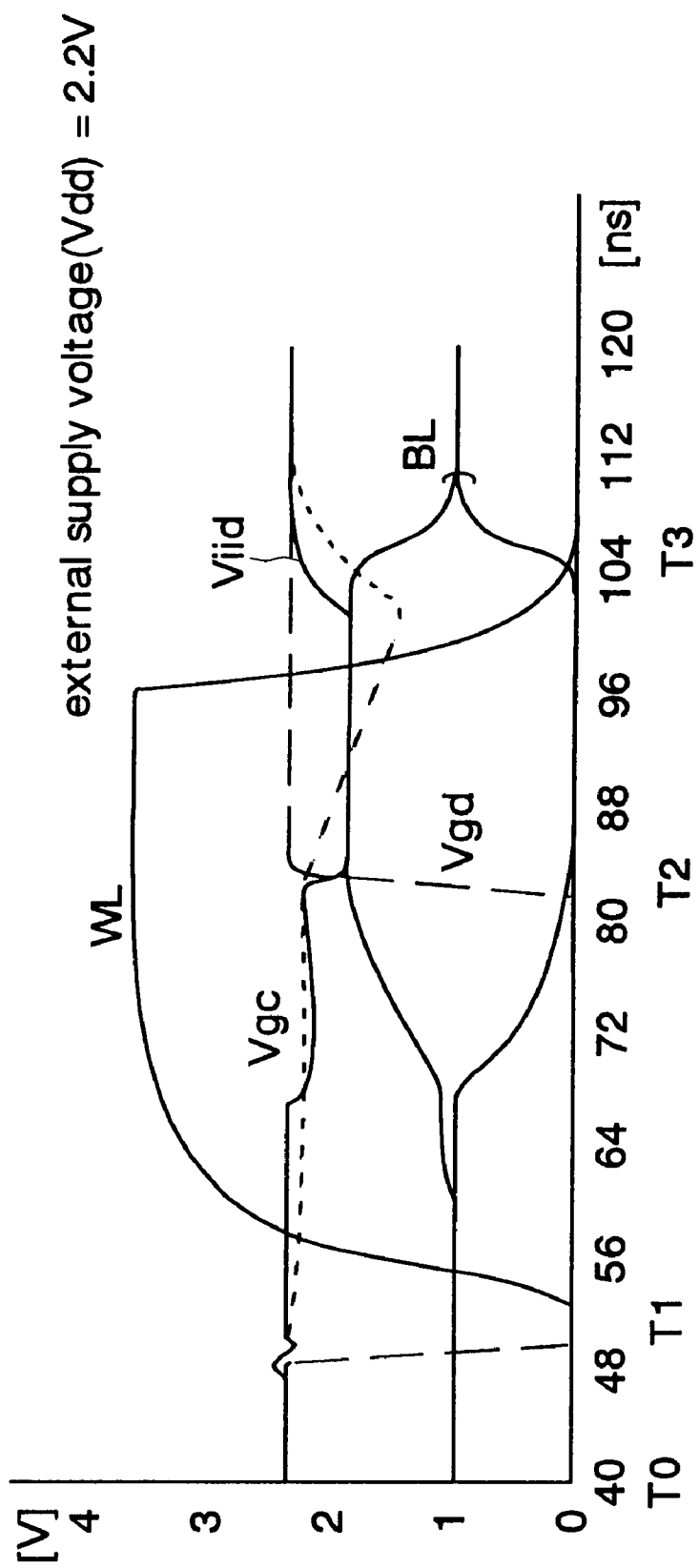
FIG. 29 is a timing chart showing the change of the sense amplifier supply voltage Viid during the memory operation in the case where the external supply voltage Vdd is set lower than standard voltage (2.2V).

The overall operation in this embodiment is shown in the timing chart of FIG. 27. Shown in FIG. 27 are the timings of the control signals of the row dummy circuit. Besides, FIG. 28 shows the variation of the sense amplifier supply voltage Viid during the operation of the memory, in the case where the external supply voltage Vdd is set at the standard value (2.5 V). Further, FIG. 29 shows the variation of the sense amplifier supply voltage Viid during the operation of the memory, in the case where the external supply voltage Vdd is at 2.2 V lower than the standard value (2.5 V). The overall operation will be described with reference to these figures.

While the memory bank is in the standby state (a period T0 through T1 indicated in the figures), the CEACG generator is kept inactivated by the activation/standby switching signal mbrs. The CESTG generator is kept activated. On this occasion, the detector DBLDET of the ODSGEN generator 234 is kept inactivated by the dummy word line controlling signal wdr. Since the overdrive controlling signal Vgd becomes the high level, the overdriving voltage Vdd is not supplied as the sense amplifier supply voltage (Viid). During the period T0 through T1, accordingly, the external supply voltage (Vdd) which is the first supply voltage delivered from the CESTG generator is supplied as the sense amplifier supply voltage (Viid).

When the memory bank has shifted from the standby state into the activation state at the time T1, the CESTG generator is inactivated by the high level of the activation/standby switching signal mbrs. On the other hand, the internal power supply controller 236 is activated to allow the generation of the cell supply voltage controlling signal Vgc. Therefore, the CEACG generator is allowed to supply the internal supply voltage (Viic) as the sense amplifier supply voltage (Viid).

Besides, the detector DBLDET in the ODSGEN generator 234 is activated by the high level of the word line controlling signal wdr. On this occasion, the dummy bit line DBL has been precharged to the voltage (½ Viic) lower than the comparing voltage Vrfc (=Viic), and hence, the overdrive controlling signal Vgd becomes the low level. Consequently, the overdriving voltage Vdd is supplied from the ODG generator as the sense amplifier supply voltage (Viid). In this case, the overdriving voltage Vdd and the internal supply voltage Viic are supplied as the sense amplifier supply voltage (Viid). Since the overdriving voltage Vdd is higher than the internal supply voltage Viic, the actual sense amplifier SA is driven by the overdriving voltage Vdd during a period T1 through T2.

The sense amplifier SA driven by the overdriving voltage Vdd amplifies the voltage difference between the bit lines BL, /BL (in FIG. 28). At this time, also the voltages of the dummy bit lines DBL, /DBL in the ODSGEN generator 234 change at the same timing as that of the voltage of the bit line BL shown in FIG. 28 (voltages DBL, /DBL shown in FIG. 27). When the voltage on the dummy bit line DBL becomes higher than the comparing voltage Vrfc (=Viic) at the time T2, the transistor N31 is turned on, and the overdrive controlling signal Vgd becomes the high level. As a result, the ODG generator stops the supply of the overdriving voltage Vdd.

At this point of time, only the internal supply voltage (Viic) for the cells is being supplied as the sense amplifier supply voltage (Viid). Accordingly, the overdriving operation of the sense amplifier SA is stopped, and the internal supply voltage Viic is supplied as the sense amplifier driving voltage Viid. In this embodiment, the comparing voltage Vrfc is set so that the overdriving of the sense amplifier SA is stopped at the timing (T2 in the figures) at which the high level voltage of the bit lines BL, /BL reaches the internal supply voltage Viic. Accordingly, even in a case where the external power supply voltage Vdd used for the overdriving of the sense amplifier SA has fluctuated, the overdriving can be stopped at the appropriate timing. Thus, the memory operation can be performed at high speed and with accuracy.

When the memory operation is ended at the time T3 by rewriting the amplified voltage of the bit lines into the memory cell, the memory bank is shifted from the activation state into the standby state. Consequently, the CEACG generator is inactivated, and the CESTG generator is activated. Since, on this occasion, the overdrive controlling signal Vgd is at the high level, the overdriving voltage Vdd is not supplied as the sense amplifier supply voltage (Viid). Accordingly, during the standby period since the time T3 till the start of the next memory operation, the voltage Vdd delivered from the CESTG generator is supplied as the sense amplifier supply voltage (Viid).

FIG. 29 shows the timings in the case where the external supply voltage Vdd is low (2.2 V). When the external supply voltage Vdd has lowered, the speed at which the overdriven sense amplifier SA amplifies the voltage difference of the bit lines BL, /BL becomes lower. Therefore, in the case where the timing of the stop of the overdriving is fixed as in the prior art, the overdriving sometimes stops before the voltage of the high level side of the bit lines BL, /BL reaches the internal supply voltage Viic.

In contrast, according to this embodiment, the timing of the stop of the overdriving can be controlled with the voltage level of the dummy bit line DBL which operates in about the same manner as that of the voltage of the high level of the actual bit lines BL, /BL. Therefore, the sense amplifier SA can be overdriven until the voltage of the high level side of the bit lines BL, /BL arrives at the internal supply voltage Viic. The overdriving can be stopped upon the arrival at the voltage Viic. As compared with the prior art, accordingly, this embodiment can control the overdriving of the sense amplifier at a more appropriate timing and control the memory operation at a higher speed.

In this manner, according to this embodiment, the overdriving of the sense amplifier SA is controlled in accordance with the dummy bit line voltage, whereby the sense amplifier SA can be appropriately overdriven even when the external supply voltage Vdd is low.

A semiconductor memory device is sometimes supplied with an external supply voltage of lower voltage in a power down mode. Even in the mode, a refresh operation needs to be cyclically performed in a dynamic random access memory. Even in such an operation mode where self-refresh is done with the external supply voltage vdd lowered, the operation of the sense amplifier SA can be appropriately controlled by controlling the sense amplifier SA as in this embodiment. In the self-refresh operation, accordingly, the sense amplifier SA can drive the bit line voltage to the high level voltage enough to read out data and can write the appropriate high level voltage into the memory cell. Thus, the timing margin of the refresh operation is enhanced.

As described above, according to the semiconductor memory device of the present invention, in a case where a sense amplifier is overdriven with a supply voltage higher than an internal supply voltage at the start of the drive thereof, the timing of the stop of the overdriving is controlled in accordance with the voltage on a dummy bit line. Therefore, even in a case where an overdriving power supply fluctuates, the above control can be performed at the optimum timing. In case of using an external power supply for an overdriving supply voltage, accordingly, the operation of the sense amplifier is always controlled optimally even when the external power supply has fluctuated or the external power supply in the power-down mode has lowered in voltage.

Incidentally, the first embodiment of the semiconductor integrated circuit has been described on the example in which the sense amplifier drivers 5 are arranged in all the regions confronting the four corners of each memory cell array 2. The present invention, however, is not restricted to such an aspect of performance. By way of example, the sense amplifier drivers 5 may well be arranged every second regions confronting the four corners of each sense amplifier. As another example, the sense amplifier drivers 5 may well be arranged in one-to-one correspondence with the sense amplifiers AMP. The same holds true also of the second and third embodiments of the semiconductor integrated circuit.

Besides, the first embodiment of the semiconductor integrated circuit has been described on the example in which the DRAM 31 is formed with the four memory core units 1 and the cruciform peripheral circuit unit 33, but two memory core units 1 and a rectangular peripheral circuit unit may well be formed. The number of the memory core units 1 and the shape of the peripheral circuit unit are not especially restricted. The same holds true also of the second and third embodiments of the semiconductor integrated circuit.

In addition, the first embodiment of the semiconductor integrated circuit has been described on the example in which the negative voltage to be given to the sense amplifier activating signal SAB is supplied from the negative voltage generator 37a for generating the resetting voltage VMI for the word line WL. However, it is also allowed by way of example to form a dedicated negative voltage generator, from which the negative voltage to be given to the sense amplifier activating signal SAB is supplied. In this case, the negative voltage to be given to the sense amplifier activating signal SAB can be set at a lower voltage. As a result, the amplifying speed of the sense amplifier AMP can be heightened more.

Further, the negative voltage to be given to the sense amplifier activating signal SAB may well be supplied from a voltage generator other than the negative voltage generator 37a and the substrate voltage generator 37b which are formed on the DRAM 31.

Although the examples in which the present invention is applied to the DRAM have been described in the first, second and third embodiments of the semiconductor integrated circuit, the invention may well be applied to, for example, a semiconductor memory such as SRAM, FeRAM (Ferroelectric RAM) or flash memory, including sense amplifiers. Alternatively, the invention may well be applied to any other semiconductor integrated circuit including sense amplifiers.

Moreover, in a case where a memory such as DRAM is implemented in a system LSI, the present invention may well be applied to the memory.

A semiconductor fabrication process to which the present invention is applied is not restricted to the CMOS process, but it may well be a Bi-CMOS process.

What is claimed is:

1. A semiconductor integrated circuit comprising:
a driver which is supplied with power supply voltages and includes a transistor having a source that is supplied with one of said power supply voltages and a drain;
a sense amplifier which is connected to said drain, and which amplifies a signal; and
a controlling circuit which supplies a gate of said transistor with a controlling voltage making gate-to-source voltage of said transistor be greater than the difference between said power supply voltages.

2. A semiconductor integrated circuit according to claim 1, further comprising:
a plurality of rectangular memory cell arrays in each of which memory cells are arranged vertically and horizontally, and in which bit lines are connected to a plurality of such memory cells aligned in one direction;
a plurality of word decoders which are juxtaposed between the sides of the two said adjacent memory cell arrays, in a direction parallel to said bit lines;
a plurality of said sense amplifiers which are juxtaposed between the sides of two said adjacent memory cell arrays, in a direction perpendicular to said bit lines; and
said driver for driving said sense amplifier row arranged in regions where the alignments running in the direction that said word decoders and that said sense amplifiers are juxtaposed in intersect.

3. A semiconductor integrated circuit comprising:
a driver which is supplied with power supply voltages and includes a pMOS transistor having a source that is supplied with a higher one of said power supply voltages and a drain;
a sense amplifier which is connected to said drain, and which amplifies a signal; and a controlling circuit which supplies a gate of said pMOS transistor with a voltage that is lower than a lower one of said power supply voltages.

4. A semiconductor integrated circuit according to claim 3, further comprising memory cells, a word line which is connected to said memory cells and which is supplied with negative voltage when unselected, and a negative voltage generator which generates said negative voltage, wherein said gate of said pMOS transistor is supplied with said negative voltage.

5. A semiconductor integrated circuit according to claim 3, further comprising a substrate voltage generator which generates negative voltage to be supplied to a substrate of nMOS transistors, wherein said gate of said pMOS transistor is supplied with said negative voltage generated by said substrate voltage generator.

6. A semiconductor integrated circuit comprising:

a driver which is supplied with power supply voltages and includes an nMOS transistor having a source that is connected to a lower one of said power supply voltages and a drain;

a sense amplifier which is connected to said drain, and which amplifies a signal; and a controlling circuit which supplies a gate of said nMOS transistor with a voltage that is the higher one of said power supply voltages.

7. A semiconductor integrated circuit according to claim 6, further comprising memory cells, a word line which is connected to said memory cells and which is supplied with a higher voltage than the voltage of the higher voltage side when selected, and a high voltage generator which generates said higher voltage, wherein said gate of said nMOS transistor is supplied with said higher voltage.

8. A semiconductor memory device comprising a sense amplifier which is coupled to memory cells through a bit line and which amplifies a voltage on the bit line and a sense amplifier controller, when said sense amplifier is activated, supplying said sense amplifier with a first supply voltage in a first period and then with said second supply voltage which is lower than the first supply voltage in a second period, wherein said sense amplifier controller includes a monitoring sense amplifier which amplifies a voltage on a dummy bit line in response to the activation of the said sense amplifier, and the sense amplifier controller supplies said sense amplifier with said second supply voltage instead of said first supply voltage in accordance with the voltage on said dummy bit line.

9. A semiconductor memory device according to claim 8, wherein when the said sense amplifier is activated, said sense amplifier controller switches said first supply voltage to said second supply voltage at a timing at which the level of said voltage of said dummy bit line reaches the level of the same in said second supply voltage.

10. A semiconductor memory device according to claim 8, wherein said monitoring sense amplifier is driven by said first supply voltage when amplifying the voltage of said dummy bit line.

11. A semiconductor memory device according to claim 8, wherein said sense amplifier controller further includes a dummy cell which is connected to said dummy bit line and which stores high data therein, and wherein electric charges in said dummy cell are fed to said dummy bit line in response to a dummy word line which is driven at about the same timing as that of the ordinary driving of an word line.

12. A semiconductor memory device according to claim 8, wherein:

said semiconductor memory device has an active period and a standby period; and said sense amplifier controller further includes:

a first supply voltage generating circuit which supplies said first supply voltage to said sense amplifier during the first period in the activation period; and a second supply voltage generating circuit which supplies said second supply voltage to said sense amplifier during the second period in the activation period.

13. A semiconductor memory device comprising a sense amplifier which is coupled to memory cells through a bit line and which amplifies the voltage on the bit line and a sense amplifier controller, when said sense amplifier is activated during an activation period, supplying said sense amplifier with a first supply voltage in a first period and then with a second supply voltage which is lower than the first supply voltage in a second period, wherein said sense amplifier controller supplies said first supply voltage to the said sense amplifier in a standby period after the activation period.

14. A semiconductor memory device according to claim 13, wherein:

said sense amplifier controller further includes:

a first supply voltage generating circuit which supplies said first supply voltage to said sense amplifier during said first period in said activation period;

a second supply voltage generating circuit which supplies said second supply voltage to said sense amplifier during said second period in said activation period; and a third supply voltage generating circuit which supplies said first supply voltage to said sense amplifier during the standby period.

15. A semiconductor memory device according to claim 13, wherein said first supply voltage is an external supply voltage, and said second supply voltage is an internal supply voltage which is generated by lowering said external supply voltage.

16. A semiconductor memory device according to claim 14, wherein said third supply voltage generating circuit forms a predetermined leakage current path from said supply voltage of said sense amplifier during said activation period.

17. A semiconductor memory device according to claim 14, wherein said second supply voltage generating circuit stops supplying said second supply voltage during said standby period.

* * * * *